(12) United States Patent
D'Evelyn et al.

(10) Patent No.: US 11,466,384 B2
(45) Date of Patent: Oct. 11, 2022

(54) METHOD OF FORMING A HIGH QUALITY GROUP-III METAL NITRIDE BOULE OR WAFER USING A PATTERNED SUBSTRATE

(71) Applicant: SLT Technologies, Inc, Los Angeles, CA (US)

(72) Inventors: Mark P. D'Evelyn, Vancouver, WA (US); Derrick S. Kamber, Camas, WA (US)

(73) Assignee: SLT Technologies, Inc., Los Angeles, CA (US)

( * ) Notice: Subject to any disclaimer, the term of this patent is extended or adjusted under 35 U.S.C. 154(b) by 76 days.

(21) Appl. No.: 16/736,274

(22) Filed: Jan. 7, 2020

(65) Prior Publication Data

US 2020/0224331 A1 Jul. 16, 2020

Related U.S. Application Data

(60) Provisional application No. 62/789,928, filed on Jan. 8, 2019.

(51) Int. Cl.
*C30B 25/04* (2006.01)
*C30B 29/40* (2006.01)
(Continued)

(52) U.S. Cl.
CPC ............ *C30B 29/406* (2013.01); *C30B 25/16* (2013.01); *C30B 25/20* (2013.01)

(58) Field of Classification Search
CPC ......... C30B 25/00; C30B 25/02; C30B 25/04; C30B 25/16; C30B 25/18; C30B 25/183;
(Continued)

(56) References Cited

U.S. PATENT DOCUMENTS 3,303,053 A 2/1967 Strong et al.
4,030,966 A 6/1977 Hornig et al.
(Continued)

FOREIGN PATENT DOCUMENTS

CN 101061570 A 10/2007
JP 2005-289797 A 10/2005
(Continued)

OTHER PUBLICATIONS

Linthicum et al. (Applied Physics Letters, 75, 196, (1999)).
(Continued)

*Primary Examiner* — Kenneth A Bratland, Jr.
(74) *Attorney, Agent, or Firm* — Patterson + Sheridan, LLP

(57) ABSTRACT

A method for forming a laterally-grown group III metal nitride crystal includes providing a substrate, the substrate including one of sapphire, silicon carbide, gallium arsenide, silicon, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), $LiGaO_2$, $Ca_8La_2(PO_4)_6O_2$, gallium nitride, or aluminum nitride (AlN), forming a pattern on the substrate, the pattern comprising growth centers having a minimum dimension between 1 micrometer and 100 micrometers, and being characterized by at least one pitch dimension between 20 micrometers and 5 millimeters, growing a group III metal nitride from the pattern of growth centers vertically and laterally, and removing the laterally-grown group III metal nitride layer from the substrate. A laterally-grown group III metal nitride layer coalesces, leaving an air gap between the laterally-grown group III metal nitride layer and the substrate or a mask thereupon.

25 Claims, 13 Drawing Sheets

(51) Int. Cl.
  *C30B 25/16* (2006.01)
  *C30B 25/20* (2006.01)

(58) Field of Classification Search
  CPC ......... C30B 25/20; C30B 29/00; C30B 29/10;
       C30B 29/40; C30B 29/403; C30B 29/406;
       C23C 16/04; C23C 16/042; C23C 16/22;
       C23C 16/30; C23C 16/301; C23C 16/303
  USPC .... 117/84, 88–90, 94–95, 97, 101–106, 937,
       117/952
  See application file for complete search history.

(56) References Cited

U.S. PATENT DOCUMENTS

| | | | |
|---|---|---|---|
| 4,066,868 A | | 1/1978 | Witkin et al. |
| 4,350,560 A | | 9/1982 | Helgoland et al. |
| 4,870,045 A | | 9/1989 | Gasper et al. |
| 5,098,673 A | | 3/1992 | Engel et al. |
| 5,127,983 A | | 7/1992 | Imai et al. |
| 5,169,486 A | | 12/1992 | Young et al. |
| 5,474,021 A | | 12/1995 | Tsuno et al. |
| 6,129,900 A | | 10/2000 | Satoh et al. |
| 6,163,557 A | * | 12/2000 | Dunnrowicz ....... H01S 5/32025 372/46.01 |
| 6,273,948 B1 | | 8/2001 | Porowski et al. |
| 6,398,867 B1 | | 6/2002 | D'Evelyn et al. |
| 6,406,540 B1 | | 6/2002 | Harris et al. |
| 6,500,257 B1 | | 12/2002 | Wang et al. |
| 6,528,427 B2 | | 3/2003 | Chebi et al. |
| 6,562,127 B1 | | 5/2003 | Kud |
| 6,596,079 B1 | | 7/2003 | Vaudo et al. |
| 6,599,362 B2 | * | 7/2003 | Ashby ................ H01L 21/0237 117/106 |
| 6,656,615 B2 | | 12/2003 | Dwilinski et al. |
| 6,686,608 B1 | | 2/2004 | Takahira |
| 6,756,246 B2 | * | 6/2004 | Hiramatsu ............. C30B 25/02 257/E21.131 |
| 6,764,297 B2 | | 7/2004 | Godwin et al. |
| 6,765,240 B2 | | 7/2004 | Tischler et al. |
| 6,784,463 B2 | | 8/2004 | Camras et al. |
| 6,787,814 B2 | | 9/2004 | Udagawa |
| 6,805,745 B2 | | 10/2004 | Snyder |
| 6,806,508 B2 | | 10/2004 | D'Evelyn et al. |
| 6,818,529 B2 | | 11/2004 | Bachrach et al. |
| 6,861,130 B2 | | 3/2005 | D'Evelyn et al. |
| 6,887,144 B2 | | 5/2005 | D'Evelyn et al. |
| 7,001,577 B2 | | 2/2006 | Zimmerman et al. |
| 7,026,756 B2 | | 4/2006 | Shimizu et al. |
| 7,053,413 B2 | | 5/2006 | D'Evelyn et al. |
| 7,063,741 B2 | | 6/2006 | D'Evelyn et al. |
| 7,078,731 B2 | | 7/2006 | D'Evelyn et al. |
| 7,098,487 B2 | | 8/2006 | D'Evelyn et al. |
| 7,101,433 B2 | | 9/2006 | D'Evelyn et al. |
| 7,112,829 B2 | | 9/2006 | Picard et al. |
| 7,119,372 B2 | | 10/2006 | Stokes et al. |
| 7,125,453 B2 | | 10/2006 | D'Evelyn et al. |
| 7,160,531 B1 | | 1/2007 | Jacques et al. |
| 7,170,095 B2 | | 1/2007 | Vaudo et al. |
| 7,175,704 B2 | | 2/2007 | D'Evelyn et al. |
| 7,198,671 B2 | | 4/2007 | Ueda |
| 7,220,658 B2 | | 5/2007 | Haskell et al. |
| 7,252,712 B2 | | 8/2007 | Dwilinski et al. |
| 7,279,040 B1 | | 10/2007 | Wang |
| 7,316,746 B2 | | 1/2008 | D'Evelyn et al. |
| 7,335,262 B2 | | 2/2008 | Dwilinski et al. |
| 7,361,576 B2 | | 4/2008 | Imer et al. |
| 7,368,015 B2 | | 5/2008 | D'Evelyn et al. |
| 7,381,391 B2 | | 6/2008 | Spencer et al. |
| 7,420,261 B2 | | 9/2008 | Dwiliński et al. |
| 7,470,938 B2 | | 12/2008 | Lee et al. |
| 7,569,206 B2 | | 8/2009 | Spencer et al. |
| 7,625,446 B2 | | 12/2009 | D'Evelyn et al. |
| 7,642,122 B2 | | 1/2010 | Tysoe et al. |
| 7,704,324 B2 | | 4/2010 | D'Evelyn et al. |
| 7,705,276 B2 | | 4/2010 | Giddings et al. |
| 7,759,710 B1 | | 7/2010 | Chiu et al. |
| 7,932,382 B2 | | 4/2011 | Wang et al. |
| 7,935,382 B2 | | 5/2011 | Park et al. |
| 7,976,630 B2 | | 7/2011 | Poblenz et al. |
| 8,021,481 B2 | | 9/2011 | D'Evelyn |
| 8,039,412 B2 | | 10/2011 | Park et al. |
| 8,048,225 B2 | | 11/2011 | Poblenz et al. |
| 8,097,081 B2 | | 1/2012 | D'Evelyn |
| 8,148,180 B2 | | 4/2012 | Felker et al. |
| 8,148,801 B2 | | 4/2012 | D'Evelyn |
| 8,278,656 B2 | | 10/2012 | Mattmann et al. |
| 8,303,710 B2 | | 11/2012 | D'Evelyn |
| 8,306,081 B1 | | 11/2012 | Schmidt et al. |
| 8,313,964 B2 | | 11/2012 | Sharma et al. |
| 8,323,405 B2 | | 12/2012 | D'Evelyn |
| 8,329,511 B2 | | 12/2012 | D'Evelyn |
| 8,354,679 B1 | | 1/2013 | D'Evelyn et al. |
| 8,430,958 B2 | | 4/2013 | D'Evelyn |
| 8,435,347 B2 | | 5/2013 | D'Evelyn et al. |
| 8,444,765 B2 | | 5/2013 | D'Evelyn |
| 8,461,071 B2 | | 6/2013 | D'Evelyn |
| 8,465,588 B2 | | 6/2013 | Poblenz et al. |
| 8,482,104 B2 | | 7/2013 | D'Evelyn et al. |
| 8,492,185 B1 | | 7/2013 | D'Evelyn et al. |
| 9,012,306 B2 | | 4/2015 | Beaumont et al. |
| 9,209,596 B1 | | 12/2015 | McLaurin et al. |
| 9,589,792 B2 | | 3/2017 | Jiang et al. |
| 9,650,723 B1 | | 5/2017 | D'Evelyn et al. |
| 9,834,859 B2 | | 12/2017 | Mori et al. |
| 10,094,017 B2 | | 10/2018 | Pocius et al. |
| RE47,114 E | | 11/2018 | D'Evelyn et al. |
| 10,400,352 B2 | | 9/2019 | D'Evelyn et al. |
| 10,619,239 B2 | | 4/2020 | Pocius et al. |
| 2001/0011935 A1 | | 8/2001 | Lee et al. |
| 2002/0155691 A1 | | 10/2002 | Lee et al. |
| 2002/0189532 A1 | | 12/2002 | Motoki et al. |
| 2003/0027014 A1 | | 2/2003 | Johnson et al. |
| 2003/0056718 A1 | | 3/2003 | Kawahara et al. |
| 2003/0082466 A1 | | 5/2003 | del Puerto et al. |
| 2003/0127041 A1 | | 7/2003 | Xu et al. |
| 2003/0128041 A1 | | 7/2003 | Byrd |
| 2003/0138732 A1 | | 7/2003 | Nagase |
| 2003/0140845 A1 | | 7/2003 | D'Evelyn et al. |
| 2003/0145784 A1 | | 8/2003 | Thompson et al. |
| 2003/0183155 A1 | | 10/2003 | D'Evelyn et al. |
| 2003/0209191 A1 | | 11/2003 | Purdy |
| 2003/0232512 A1 | | 12/2003 | Dickinson et al. |
| 2004/0000266 A1 | | 1/2004 | D'Evelyn et al. |
| 2004/0007763 A1 | | 1/2004 | Cunningham |
| 2004/0023427 A1 | | 2/2004 | Chua et al. |
| 2004/0124435 A1 | | 7/2004 | D'Evelyn et al. |
| 2004/0245535 A1 | | 12/2004 | D'Evelyn et al. |
| 2005/0087753 A1 | | 4/2005 | D'Evelyn et al. |
| 2005/0093003 A1 | | 5/2005 | Shibata |
| 2005/0098095 A1 | | 5/2005 | D'Evelyn et al. |
| 2005/0118349 A1 | | 6/2005 | Whitehead et al. |
| 2005/0128469 A1 | | 6/2005 | Hall et al. |
| 2005/0152820 A1 | | 7/2005 | D'Evelyn et al. |
| 2005/0170611 A1 | | 8/2005 | Ghyselen et al. |
| 2005/0205215 A1 | | 9/2005 | Giddings et al. |
| 2006/0032428 A1 | | 2/2006 | Dwilinski et al. |
| 2006/0037529 A1 | | 2/2006 | D'Evelyn et al. |
| 2006/0037530 A1 | | 2/2006 | Dwilinski et al. |
| 2006/0048699 A1 | | 3/2006 | D'Evelyn et al. |
| 2006/0084245 A1 | | 4/2006 | Kohda |
| 2006/0096521 A1 | | 5/2006 | D'Evelyn et al. |
| 2006/0124051 A1 | | 6/2006 | Yoshioka et al. |
| 2006/0177362 A1 | | 8/2006 | D'Evelyn et al. |
| 2006/0207497 A1 | | 9/2006 | D'Evelyn et al. |
| 2006/0213429 A1 | | 9/2006 | Motoki et al. |
| 2006/0228870 A1 | | 10/2006 | Oshima |
| 2006/0228901 A1 | | 10/2006 | Yoon et al. |
| 2006/0255341 A1 | | 11/2006 | Pinnington et al. |
| 2006/0288927 A1 | | 12/2006 | Chodelka et al. |
| 2007/0012943 A1 | * | 1/2007 | Okahisa ................ C30B 25/02 257/102 |
| 2007/0057337 A1 | | 3/2007 | Kano et al. |
| 2007/0105351 A1 | | 5/2007 | Motoki et al. |

(56) References Cited

U.S. PATENT DOCUMENTS

| | | |
|---|---|---|
| 2007/0131967 A1 | 6/2007 | Kawaguchi et al. |
| 2007/0138505 A1* | 6/2007 | Preble ................. H01L 21/0242 |
| | | 257/190 |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0231978 A1 | 10/2007 | Kanamoto et al. |
| 2007/0234946 A1 | 10/2007 | Hashimoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0156254 A1 | 7/2008 | Dwilinski et al. |
| 2008/0193363 A1 | 8/2008 | Tsuji |
| 2008/0272462 A1 | 11/2008 | Shimamoto et al. |
| 2009/0092536 A1 | 4/2009 | Kawabata et al. |
| 2009/0140287 A1 | 6/2009 | Fujiwara et al. |
| 2009/0170286 A1 | 7/2009 | Tsukamoto et al. |
| 2009/0218593 A1 | 9/2009 | Kamikawa et al. |
| 2009/0236694 A1 | 9/2009 | Mizuhara et al. |
| 2009/0250686 A1 | 10/2009 | Sato et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0065854 A1* | 3/2010 | Kamber ................. H01L 21/0237 |
| | | 257/76 |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0151194 A1 | 6/2010 | D'Evelyn |
| 2010/0187568 A1* | 7/2010 | Arena ................. H01L 21/02647 |
| | | 257/190 |
| 2010/0189981 A1 | 7/2010 | Poblenz et al. |
| 2010/0219505 A1 | 9/2010 | D'Evelyn |
| 2010/0243988 A1 | 9/2010 | Kamikawa et al. |
| 2011/0062415 A1 | 3/2011 | Ohta et al. |
| 2011/0064103 A1 | 3/2011 | Ohta et al. |
| 2011/0068347 A1 | 3/2011 | Strittmatter |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0124139 A1 | 5/2011 | Chang |
| 2011/0158275 A1 | 6/2011 | Yoshizumi et al. |
| 2011/0175200 A1 | 7/2011 | Yoshida |
| 2011/0183498 A1 | 7/2011 | D'Evelyn |
| 2011/0186860 A1 | 8/2011 | Enya et al. |
| 2011/0220912 A1 | 9/2011 | D'Evelyn |
| 2011/0256693 A1 | 10/2011 | D'Evelyn et al. |
| 2011/0260189 A1 | 10/2011 | Kim |
| 2011/0309373 A1 | 12/2011 | Sharma et al. |
| 2012/0000415 A1 | 1/2012 | D'Evelyn et al. |
| 2012/0091465 A1* | 4/2012 | Krames ................. H01L 21/02639 |
| | | 257/76 |
| 2012/0104359 A1 | 5/2012 | Felker et al. |
| 2012/0104412 A1 | 5/2012 | Zhong et al. |
| 2012/0112320 A1 | 5/2012 | Kubo et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2013/0112987 A1 | 5/2013 | Fu et al. |
| 2013/0119401 A1 | 5/2013 | D'Evelyn et al. |
| 2013/0126902 A1 | 5/2013 | Isozaki et al. |
| 2013/0251615 A1 | 9/2013 | D'Evelyn et al. |
| 2013/0323490 A1 | 12/2013 | D'Evelyn et al. |
| 2014/0050244 A1 | 2/2014 | Ohno et al. |
| 2014/0065360 A1 | 3/2014 | D'Evelyn et al. |
| 2014/0147650 A1* | 5/2014 | Jiang ................. H01L 21/02642 |
| | | 428/220 |
| 2014/0217553 A1* | 8/2014 | Arena ................. C30B 29/403 |
| | | 257/615 |
| 2017/0362739 A1 | 12/2017 | Kajimoto et al. |
| 2018/0087185 A1 | 3/2018 | Yoshida |
| 2018/0202067 A1 | 7/2018 | Hirao et al. |
| 2019/0189439 A1 | 6/2019 | Mikawa et al. |
| 2020/0087813 A1 | 3/2020 | D'Evelyn et al. |

FOREIGN PATENT DOCUMENTS

| | | |
|---|---|---|
| JP | 2005-298269 A | 10/2005 |
| JP | 2006-315947 A | 11/2006 |
| JP | 2007-039321 A | 2/2007 |
| JP | 2016037426 A | 3/2016 |
| JP | 2016088756 A | 5/2016 |
| WO | 2004/061923 A1 | 7/2004 |
| WO | 2005121415 A1 | 12/2005 |
| WO | 2006/038467 A1 | 4/2006 |
| WO | 2006/057463 A1 | 6/2006 |
| WO | 2007/004495 A1 | 1/2007 |
| WO | 2010/068916 A1 | 6/2010 |
| WO | 2011/044554 A1 | 4/2011 |
| WO | 2012/016033 A1 | 2/2012 |

OTHER PUBLICATIONS

Chen et al. (Applied Physics Letters 75, 2062 (1999)).

Chen et al. (Japanese Journal of Applied Physics 42, L818 (2003)).

Dorsaz et al., Selective oxidation of AlInN layers for current confinement in III-nitride devices, Applied Physics Letters 87, 072102 (2005), 3 pages.

Pattison et al., Gallium nitride based microcavity light emitting diodes with 2_effective cavity thickness, Applied Physics Letters 90, 031111 (2007), 3 pages.

Choi et al., 2.5λ microcavity InGaN light-emitting diodes fabricated by a selective dry-etch thinning process, Applied Physics Letters 91, 061120 (2007), 3 pages.

Altoukhov et al., High reflectivity airgap distributed Bragg reflectors realized by wet etching of AlInN sacrificial layers Applied Physics Letters 95, 1191102 (2009), 3 pages.

Tyagi et al., Partial strain relaxation via misfit dislocation generation at heterointerfaces in (Al,In)GaN epitaxial layers grown on semipolar (1122) GaN free standing substrates, Applied Physics Letters 95, 1191102 (2009), 3 pages.

Porowski et al., High resistivity GaN single crystalline substrates, Appa Vo. 92 (1997), 5 pages.

Wang et al., Ammonothermal growth of GaN crystals in alkaline solutions, Journal of Crystal Growth 287 (2006) pp. 376-380, 5 pages.

Gladkov et al., Effect of Fe doping on optical properties of free-standing semi-insulating HVPE GaN:Fe, Journal of Crystal Growth 312 (2010) pp. 1205-1209, 5 pages.

(56) References Cited

OTHER PUBLICATIONS

Moutanabbir et al., Bulk GaN Ion Cleaving, Journal of Electronic Materials, vol. 39, No. 5, (2010) pp. 482-488, 7 pages.

Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.

Weisbuch et al., Recent results and latest views on microcavity LEDs, Proc. of SPIE, vol. 5366, 2009, pp. 1-19, 19 pages.

Fang et al., Deep centers in semi-insulating Fe-doped native GaN substrates grown by hydride vapour phase epitaxy, phys. stat. sol. (c) 5, No. 6, pp. 1508-1511 (2008), 4 pages.

International Search Report dated Nov. 2, 2020 for Application No. PCT/US2020/034405).

International Search Report dated May 6, 2021 for Application No. PCT/US2021/017514.

Grzegory, 'High pressure growth of bulk GaN from Solutions in gallium', Journal of Physics Condensed Matter, vol. 13, 2001, pp. 6875-6892.

Porowski, 'Near Defect Free GaN Substrates', Journal of Nitride Semiconductor, 1999, pp. 1-11.

Sharma et al., 'Vertically oriented GaN-based air-gap distributed Bragg reflector structure fabricated using band-gap-selective photoelectrochemical etching', Applied Physics Letters, vol. 87, 2005, pp. 051107.

Sumiya et al., 'High-pressure synthesis of high-purity diamond crystal', Diamond and Related Materials, 1996, vol. 5, pp. 1359-1365.

Chakraborty et al., 'Defect Reduction in Nonpolar a-Plane GaN Films Using in situ SiNx Nanomask', Applied Physics Letters, vol. 89, 2006, pp. 041903-1-041903-3.

Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.

Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.

Nakamura et al., 'GaN Growth Using GaN Buffer Layer', Japanese Journal of Applied Physics, vol. 30, No. 10A, 1991, pp. L1705-L1707.

Sumiya et al., 'Growth Mode and Surface Morphology of a GaN Film Deposited Along The N-Face Polar Direction on c-Plane Sapphire Substrate', Journal of Applied Physics, vol. 88, No. 2, 2000, pp. 1158-1165.

Callahan et al., 'Synthesis and Growth of Gallium Nitride by The Chemical Vapor Reaction Process (CVRP)', MRS Internet Journal Nitride Semiconductor Research, vol. 4, No. 10, 1999, pp. 1-6.

D'Evelyn et al., 'Bulk GaN Crystal Growth by the High-Pressure Ammonothermal Method', Journal of Crystal Growth, vol. 300, 2007, pp. 11-16.

Dwilinski et al., 'Ammono Method of BN, AlN and GaN Synthesis and Crystal Growth', MRS Internet Journal Nitride Semiconductor Research, vol. 3, No. 25, 1998, pp. 1-5.

Dwilinski et al., "Excellent crystallinity of truly bulk ammonothermal GaN", "Journal of Crystal Growth", vol. 310 (2008), pp. 3911-3916.

Ehrentraut et al., 'The ammonothermal crystal growth of gallium nitride-A technique on the up rise', Proceedings IEEE, 2010, 98(7), pp. 1316-1323.

Fujito et al., 'Development of Bulk GaN Crystals and Nonpolar/Semipolar Substrates by HVPE', MRS Bulletin, May 2009, vol. 34, No. 5, pp. 313-317.

Fukuda et al., "Prospects for the ammonothermal growth of large GaN crystal", "Journal of Crystal Growth", vol. 305 (2007), pp. 304-310.

Hashimoto et al., 'A GaN bulk crystal with improved structural quality grown by the ammonothermal method', Nature Materials, vol. 6, 2007, pp. 568-671.

Hashimoto et al., 'Ammonothermal Growth of Bulk GaN', Journal of Crystal Growth, vol. 310, 2008, pp. 3907-3910.

Kolis et al., 'Materials Chemistry and Bulk Crystal Growth of Group III Nitrides in Supercritical Ammonia', Material Resources Society Symposium Proceedings, vol. 495, 1998, pp. 367-372.

Motoki et al., 'Growth and Characterization of Freestanding GaN Substrates', Journal of Crystal Growth, vol. 237-239, 2002, pp. 912-921.

Cao et al., "Defect generation in InGaN/GaN light-emitting diodes under forward and reverse electrical stresses," Microelectronics Reliability, 2003, vol. 43, pp. 1987-1991.

Schubert et al., "Effect of dislocation density on efficiency droop in light-emitting diodes," Applied Physics Letters, 2007, vol. 91, p. 231114.

Tomiya et al., "Dislocation Related Issues in the Degradation of GaN-Based Laser Diodes," IEEE Journal of Selected Topics in Quantum Electronics, 2004, vol. 10, No. 6, pp. 1277-1286.

Orita et al., "Analysis of Diffusion Involved in Degradation of InGaN-based Laser Diodes," IEEE International Reliability Physics Symposium Proceedings, 2009, pp. 736-740.

Kaun et al., "Effects of Threading Dislocation Density on the Gate Leakage of AlGaN/GaN Heterostructures for High Electron Mobility Transistors," Applied Physics Express, 2011, vol. 4, p. 024101.

Tapajna et al., Applied Physics Letters, 2011, 99(22), 223501-223503 Tapajna et al., "Influence of threading dislocation density on early degradation in AlGaN/GaN high electron mobility transistors," Applied Physics Letters, 2011, vol. 99, pp. 223501.

Darakchieva et al., "Lattice parameters of bulk GaN fabricated by halide vapor phase epitaxy," Journal of Crystal Growth, 2008, vol. 310, pp. 959-965.

S. K. Mathis et al., "Modeling of threading dislocation reduction in growing GaN layers," Journal of Crystal Growth, 2001, vol. 231, pp. 371-390.

Office Action dated Oct. 7, 2021 for U.S. Appl. No. 16/550,947.
Office Action dated Jan. 27, 2022 for U.S. Appl. No. 16/550,947.

* cited by examiner

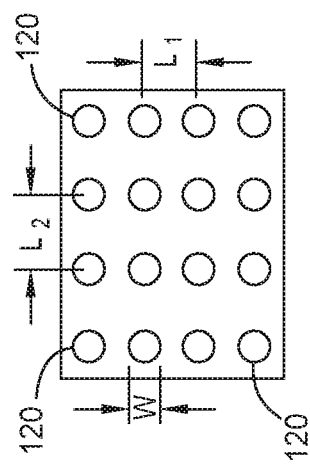
FIG. 1L
2D HEXAGONAL ARRAY
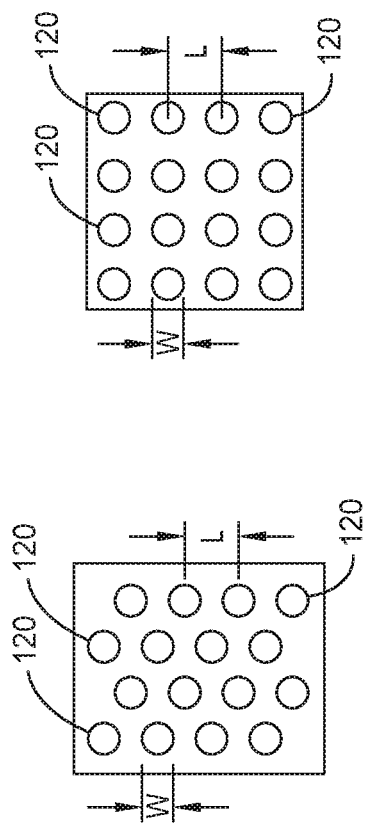
FIG. 1M
2D SQUARE ARRAY
FIG. 1N
2D RECTANGULAR ARRAY
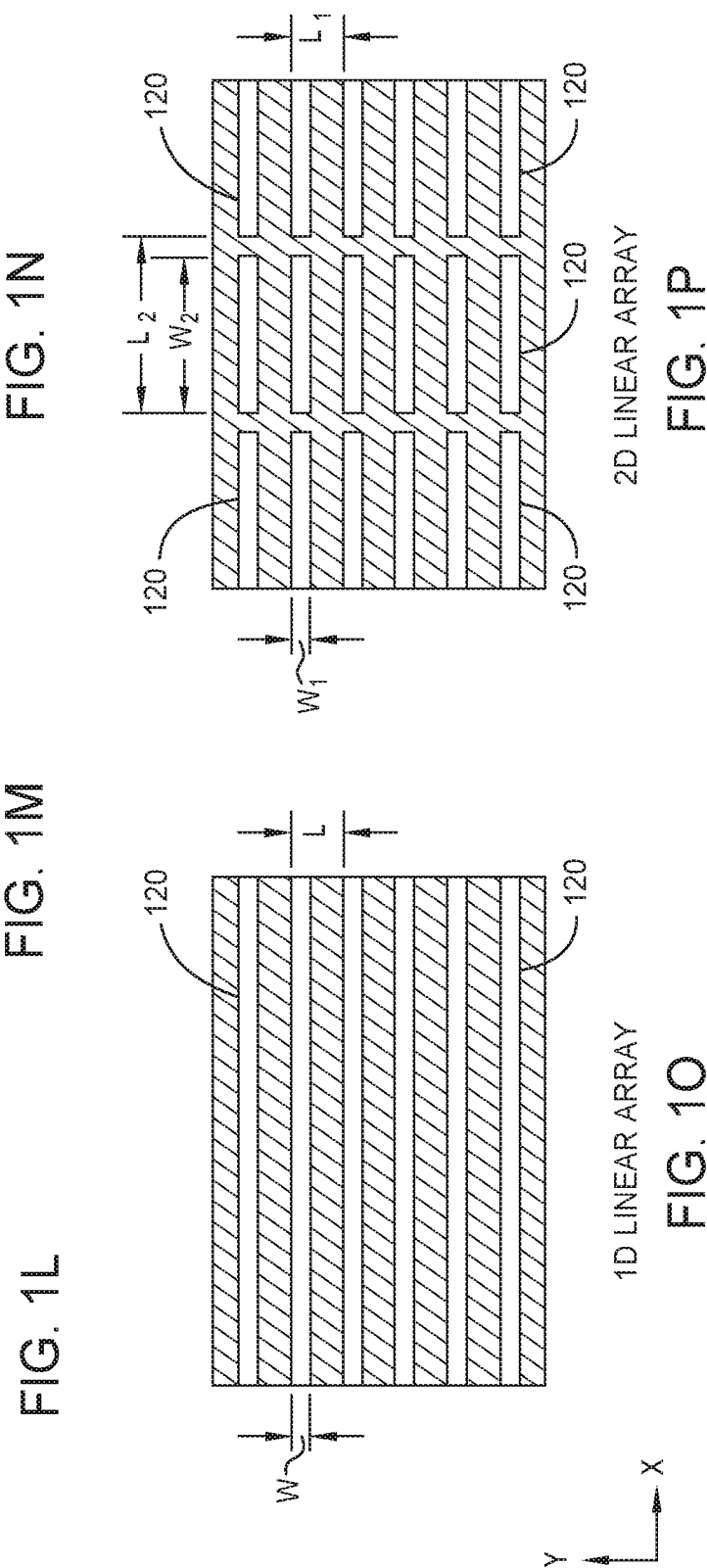
FIG. 1O
1D LINEAR ARRAY
FIG. 1P
2D LINEAR ARRAY

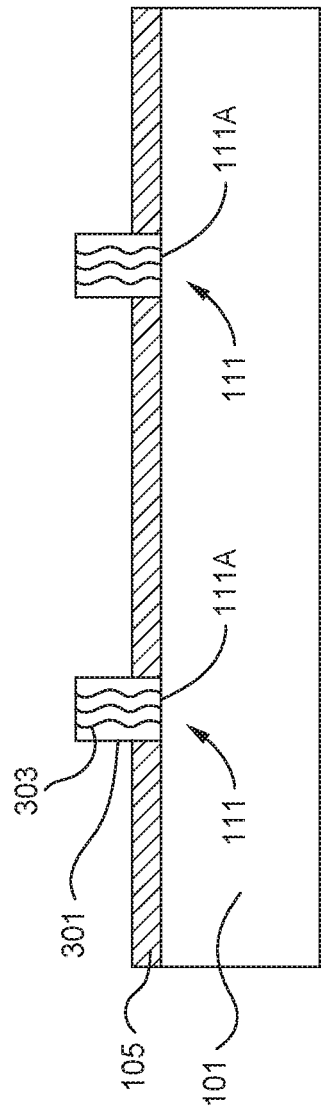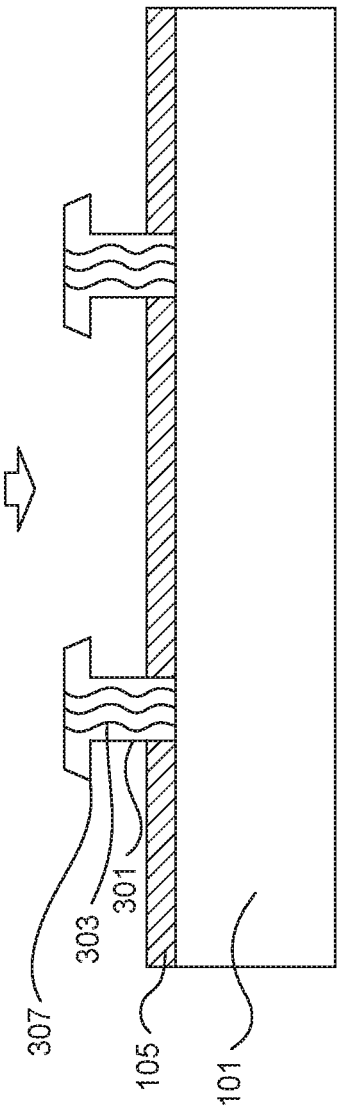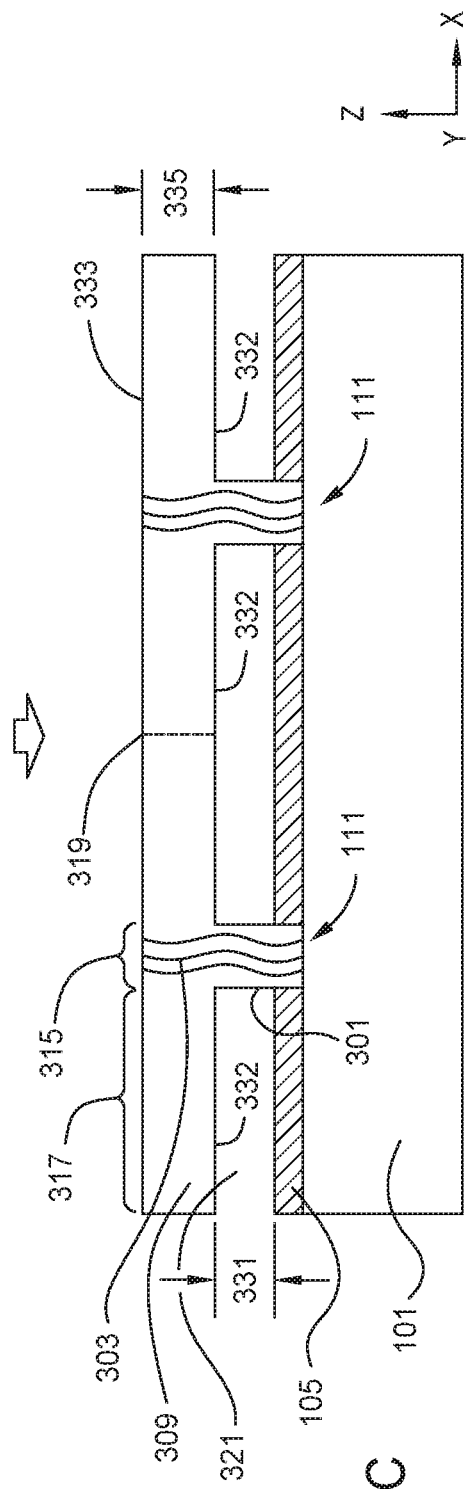

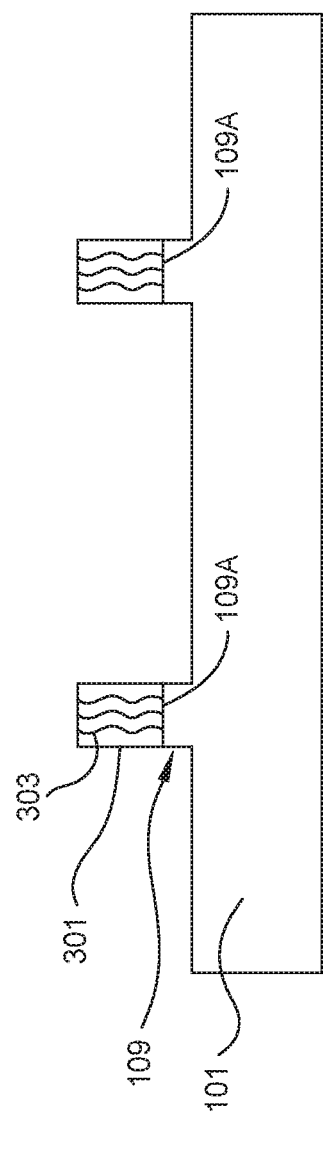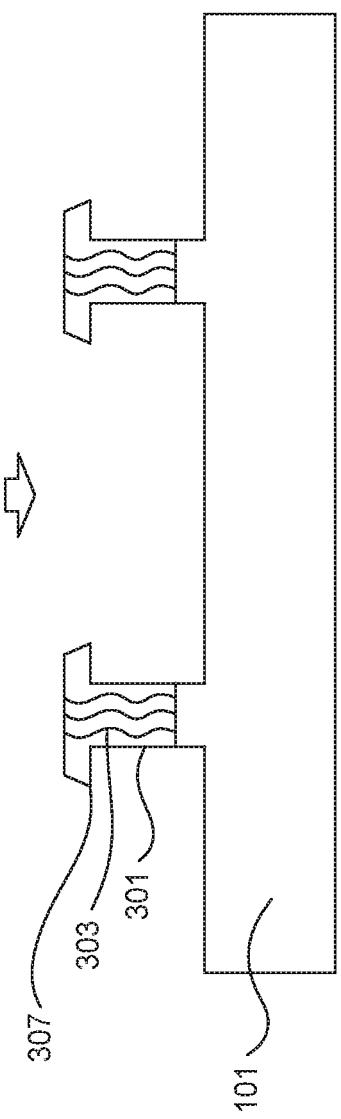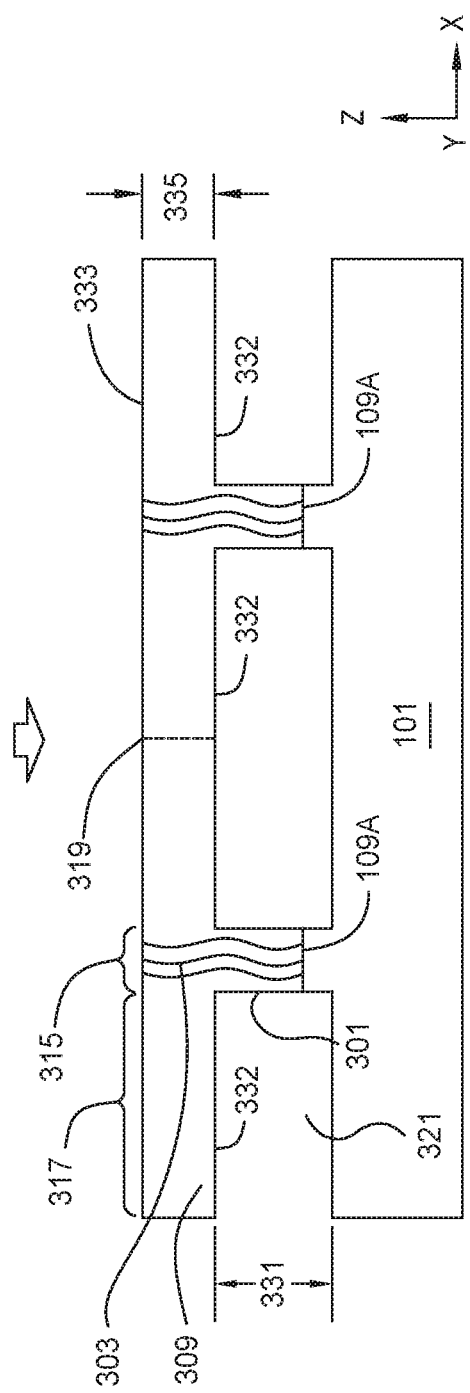

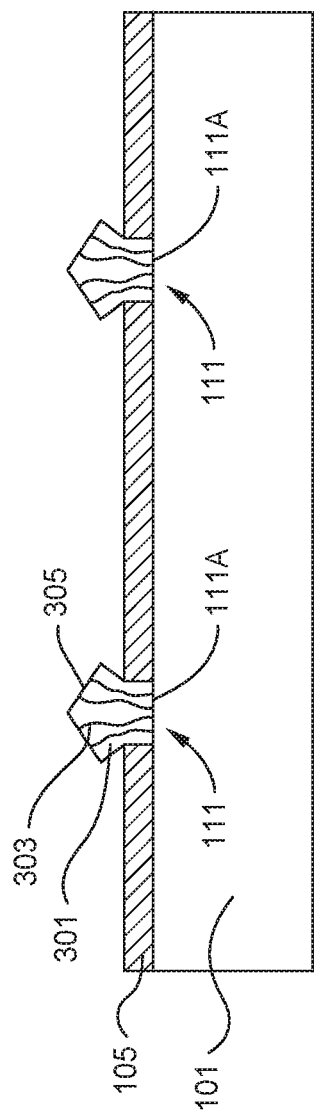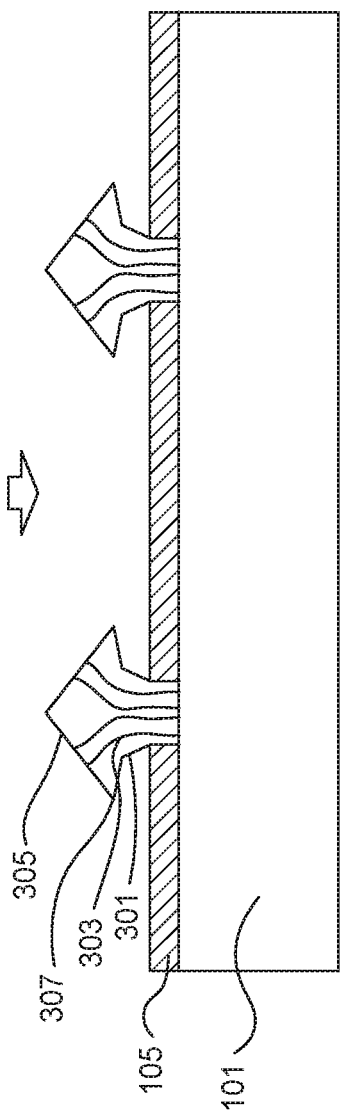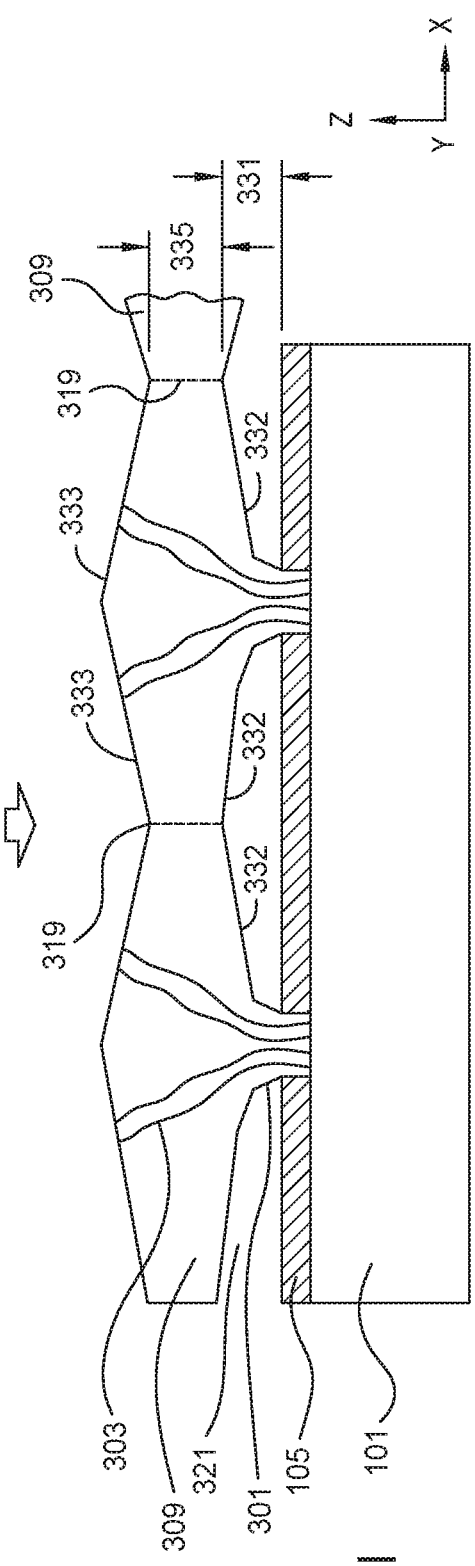

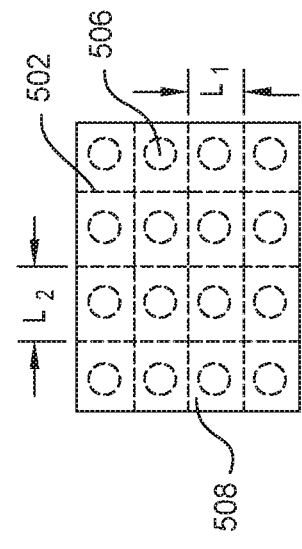
FIG. 5C
2D RECTANGULAR PATTERN
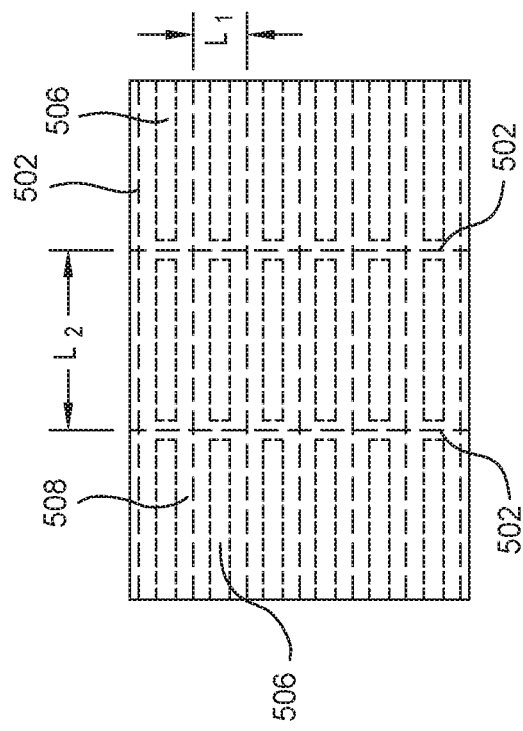
FIG. 5E
2D RECTANGULAR PATTERN
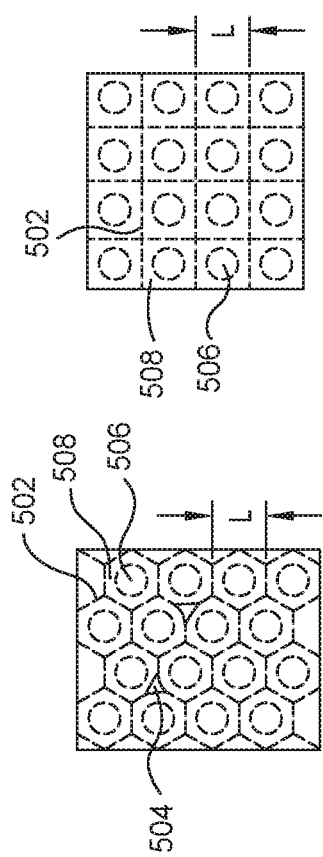
FIG. 5A
2D HEXAGONAL PATTERN
FIG. 5B
2D SQUARE PATTERN
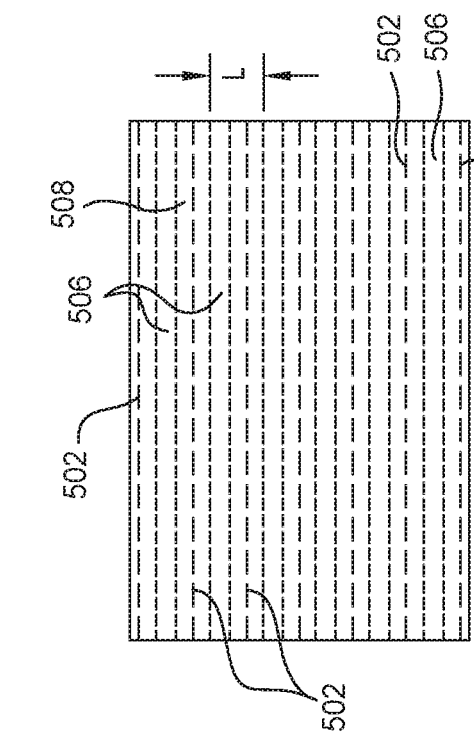
FIG. 5D
1D LINEAR PATTERN

METHOD OF FORMING A HIGH QUALITY GROUP-III METAL NITRIDE BOULE OR WAFER USING A PATTERNED SUBSTRATE

CROSS-REFERENCE TO RELATED APPLICATIONS

This application claims the benefit to U.S. Provisional Application No. 62/789,928, filed Jan. 8, 2019, which is incorporated by reference herein.

BACKGROUND OF THE DISCLOSURE

Field

This disclosure relates generally to techniques for processing materials for manufacture of group-III metal nitride substrates, including gallium-containing nitride substrates. More specifically, embodiments of the disclosure include techniques for growing large area substrates using a combination of processing techniques. The disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting, hydrogen generation, photo detectors, integrated circuits, power diodes, transistors, and others.

Description of the Related Art

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate such as sapphire, silicon, or GaAs, which provide the benefit of commercial availability in large diameter at modest cost. This approach generally gives rise to threading dislocations at average concentrations of $10^5$-$10^7$ cm$^{-2}$ over the surface of thick boules, as well as significant bow, stress, and strain. In addition, the strain results in a crystallographic radius of curvature of, typically, about 1 to 10 meters and a variation in the crystallographic miscut across the diameter of 50 mm or 100 mm wafers prepared from these boules in the range of 0.1 to 1 degree or more. Reductions in the concentration of threading dislocations and in miscut variation are desirable for a number of applications. Bow, stress, and strain can cause low yields when slicing the boules into wafers, make the wafers susceptible to cracking during down-stream processing, and may also negatively impact device reliability and lifetime. Miscut variation causes variable uptake of various species during the growth of epitaxial layers. For example, variable uptake of indium causes variation in the emission wavelength of LED or laser device structures across a wafer, requiring device makers to measure the output of each individual device and to bin accordingly, raising cost. Miscut variation has also been found to decrease the reliability and lifetime of power devices such as diodes and transistors. A further consequence of bow, stress, and strain is that, during growth in m-plane and semipolar directions, even by near-equilibrium techniques such as ammonothermal growth, significant concentrations of stacking faults may be generated. In addition, the quality of c-plane growth may be unsatisfactory, due to formation of cracks, multiple crystallographic domains, and the like. Capability to manufacture substrates larger than 4 inches is currently very limited, as is the capability to produce large-area GaN substrates with a nonpolar or semipolar crystallographic orientation.

Ammonothermal crystal growth has a number of advantages over hydride vapor phase epitaxy (HVPE) as a means for manufacturing GaN boules. However, the performance of ammonothermal GaN crystal growth processing may be significantly dependent on the size and quality of seed crystals. Seed crystals fabricated by conventional HVPE methods may suffer from both a lattice mismatch with respect to newly-grown ammonothermal material and from many of the limitations described above, and large area ammonothermally-grown crystals are not widely available.

Due to at least the issues described above, there is a need for substrates that have a lower defect density and are formed by techniques that improve the crystal growth process. Also, from the above, it is seen that techniques for improving crystal growth are highly desirable.

BRIEF SUMMARY OF THE DISCLOSURE

Embodiments of the disclosure generally include methods for processing materials for manufacture of gallium based substrates, more specifically, methods for growing large-area boules or wafers using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

The methods described herein provide means for fabricating large-area group III metal nitride boules or wafers having reduced defects. The methods described herein thus provide means for fabricating high-performance light emitting diodes and/or laser diodes that avoid potential issues associated with defective regions in the large-area group III metal nitride boules or wafers.

Embodiments of the disclosure may provide a method for forming a group III metal nitride crystal, comprising forming a pattern on a substrate, growing a group III metal nitride layer from the pattern of growth centers vertically and laterally, wherein a laterally-grown group III metal nitride layer coalesces in a region disposed between adjacent growth centers, and forming a gap having a maximum vertical dimension between 25 micrometers and 5 millimeters between a surface of the laterally-grown group III metal nitride layer and an oppositely facing surface of the substrate or a mask thereupon, and then separating the laterally-grown group III metal nitride layer from the substrate. The pattern on a substrate comprising growth centers having a minimum dimension between 1 micrometer and 100 micrometers, and being characterized by at least one pitch dimension between 20 micrometers and 5 millimeters, and the substrate may comprise one of sapphire, silicon carbide, gallium arsenide, silicon, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), $LiGaO_2$, $Ca_8La_2(PO_4)_6O_2$, gallium nitride (GaN), or aluminum nitride (AlN).

Embodiments of the disclosure may also include a free-standing group III metal nitride crystal, comprising a group III metal selected from gallium, aluminum, indium, and a combination of any of the foregoing, and nitrogen. The free-standing group III metal nitride crystal having a wurtzite crystal structure that comprises a first surface having a maximum dimension greater than 10 millimeters in a first direction, an average concentration of threading dislocations between $10^2$ $cm^{-2}$ and $10^8$ $cm^{-2}$, and an average concentration of stacking faults below $10^3$ $cm^{-1}$, a concentration of oxygen, averaged over the first surface, between about $1 \times 10^{17}$ $cm^{-3}$ and about $5 \times 10^{20}$ $cm^{-3}$, and a concentration of fluorine, sodium, and potassium that are each below $3 \times 10^{15}$ $cm^{-3}$, or below a sensitivity limit of a concentration measurement technique, whichever is greater. The free-standing group III metal nitride crystal also having a thickness, in a direction perpendicular to the first surface, of at least 100 micrometers. The first surface of the free-standing group III metal nitride crystal having a plurality of coalescence front regions, each of the plurality of coalescence front regions having a locally-approximately-linear array of threading dislocations with a concentration between 5 $cm^{-1}$ and $10^5$ $cm^{-1}$, a plurality of wing regions, each of the plurality of wing regions being disposed between an adjacent pair of the plurality of coalescence front regions and having a concentration of threading dislocations below $10^5$ $cm^{-2}$ and a concentration of stacking faults below $10^3$ $cm^{-1}$, and a plurality of window regions, each of the plurality of window regions being disposed within one of the plurality of wing regions or between an adjacent pair of wing regions and having a minimum dimension between 10 micrometers and 500 micrometers and threading dislocations with a concentration between $10^4$ $cm^{-2}$ and $10^8$ $cm^{-2}$. The concentration of threading dislocations on the first surface may vary periodically, such as by at least a factor of two in the first direction, and the period of the variation in concentration of threading dislocations in the first direction may be between 5 micrometers and 20 millimeters. The free-standing group III metal nitride crystal may further include a symmetric x-ray rocking curve full width at half maximum less than 200 arcsec.

BRIEF DESCRIPTION OF THE DRAWINGS

FIGS. 1L-1P include top views of arrangements of openings in a patterned mask layer on a seed crystal or a substrate according to an embodiment of the present disclosure.

FIGS. 3A, 3B and 3C are simplified diagrams illustrating an epitaxial lateral overgrowth process for forming a large-area group III metal nitride crystal according to an embodiment of the present disclosure.

FIGS. 3D, 3E and 3F are simplified diagrams illustrating another epitaxial lateral overgrowth process for forming a large-area group III metal nitride crystal according to an embodiment of the present disclosure.

FIGS. 3G, 3H and 3I are simplified diagrams illustrating another epitaxial lateral overgrowth process for forming a large-area group III metal nitride crystal according to an embodiment of the present disclosure.

FIGS. 5A-5E are simplified diagrams illustrating threading dislocation patterns on a free-standing group III metal nitride boule or wafer according to an embodiment of the present disclosure.

Figure 1A:
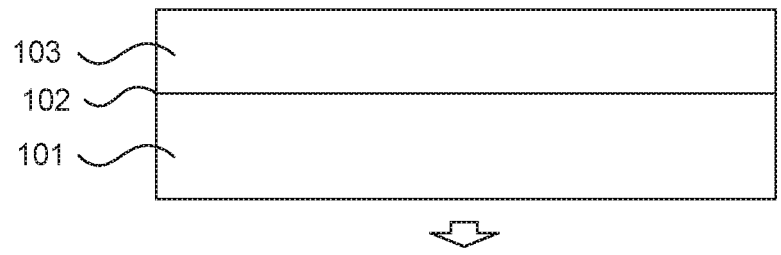
FIGS. 1A, 1B and 1C include simplified diagrams illustrating a method of forming a patterned photoresist layer on a seed crystal or a substrate according to an embodiment of the present disclosure.
Figure 1B:
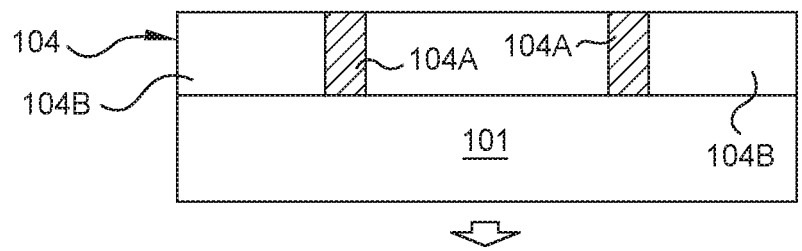

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION OF THE DISCLOSURE

According to the present disclosure, techniques related to techniques for processing materials for manufacture of group-III metal nitride and gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

Threading dislocations in GaN are known to act as strong non-radiative recombination centers which can severely limit the efficiency of GaN-based LEDs and laser diodes. Non-radiative recombination generates local heating which may lead to faster device degradation (Cao et al., *Microelectronics Reliability,* 2003, Vol. 43, pp. 1987-1991). In high-power applications, GaN-based devices suffer from decreased efficiency with increasing current density, known as droop. There is evidence suggesting a correlation between dislocation density and the magnitude of droop in LEDs (Schubert et al., *Applied Physics Letters,* 2007, Vol. 91, p. 231114). For GaN-based laser diodes there is a well-documented negative correlation between dislocation density and mean time to failure (MTTF) (Tomiya et al., *IEEE Journal of Selected Topics in Quantum Electronics,* 2004, Vol. 10, No. 6, pp. 1277-1286), which appears to be due to impurity diffusion along the dislocations (Orita et al., *IEEE International Reliability Physics Symposium Proceedings,* 2009, pp. 736-740). For electronic devices, dislocations have been shown to markedly increase the leakage current (Kaun et al., *Applied Physics Express,* 2011, Vol. 4, p. 024101) and reduce the device lifetime (Tapajna et al., *Applied Physics Letters,* 2011, Vol. 99, pp. 223501-223503) in HEMT structures. One of the primary advantages of using bulk GaN as a substrate material for epitaxial thin film growth is a large reduction in the concentration of threading dislocations in the film. Therefore, the dislocation density in the bulk GaN substrate will have a significant impact on the device efficiency and the reliability.

As noted above, lateral epitaxial overgrowth (LEO) is a method that has been widely applied to improvement in the crystallographic quality of films grown by vapor-phase methods. For example, methods have been reported whereby GaN layers were nucleated on a sapphire substrate, a $SiO_2$ mask with a periodic array of openings was deposited on the GaN layer, and then GaN was grown by metalorganic chemical vapor deposition (MOCVD) through the openings in the $SiO_2$ mask layer, grew laterally over the mask, and coalesced. The dislocation density in the areas above the openings in the mask were very high, similar to the layer below the mask, but the dislocation density in the laterally-overgrown regions was orders of magnitude less. This method is attractive because it can be applied to large area substrates, significantly reducing their dislocation density. Similar methods, with variations, have been applied by a number of groups to vapor-phase growth of GaN layers. These methods are variously referred to as LEO, epitaxial lateral overgrowth (ELO or ELOG), selective area growth (SAG), and dislocation elimination by epitaxial growth with inverse pyramidal pits (DEEP), or the like. In the case of essentially all variations of this method, it is believed that a thin heteroepitaxial GaN layer is grown on a non-GaN substrate, a patterned mask is deposited on the GaN layer, and growth is re-initiated in a one-dimensional or two-dimensional array of openings in the mask. The period or pitch of the growth locations defined by the openings in the mask is typically between 2 and 400 micrometers, most typically between about 5 and 100 micrometers. The individual GaN crystallites or regions grow and then coalesce. Epitaxial growth may then be continued on top of the coalesced GaN material to produce a thick film or "ingot." A relatively thick GaN layer may be deposited on the coalesced GaN material by HVPE. The LEO process is capable of large reductions in the concentration of dislocations, particularly in the regions above the mask, typically to levels of about $10^5$-$10^7$ cm$^{-2}$. However, the laterally-grown wings of the formed LEO layer may be crystallographically tilted from the underlying substrate ("wing tilt"), by as much as several degrees, which may be acceptable for a thin-film process but may not be acceptable for a bulk crystal growth process, as it may give rise to stresses and cracking as well as unacceptable variation in surface crystallographic orientation.

Several factors limit the capability of the LEO method, as conventionally applied, to reduce the average dislocation density below about $10^5$ to $10^7$ cm$^{-2}$, or to reduce the miscut variation across a 50 or 100 mm wafer to below about 0.1 degree. First, the pitch of the pattern of openings formed in the mask layer tends to be modest, but larger pitches may be desirable for certain applications. Second, c-plane LEO growth is generally performed in the [0001], or Ga-face direction, which creates at least two limitations. One limitation is that M-direction growth rates tend to be lower than those of [0001] direction growth rates and semipolar (10-11) facets often form, with the consequence that the overall crystal diameter decreases with increasing thickness and making coalescence of large-pitch patterns difficult. In addition, another limitation is that growth in the [0001] direction tends to exclude oxygen, in stark contrast to growth in other crystallographic directions. As a consequence, there may be a significant lattice mismatch between a [0001]-grown HVPE crystal used as a seed and the crystal grown upon it by another technique. In addition, if semipolar facets form during the LEO process there may be a significant variation in oxygen (or other dopant) level, giving rise to lateral variations in the lattice constant and stresses that can cause cracking in the LEO crystal itself or in a crystal grown on the latter, used as a seed.

Variations of the LEO method have been disclosed for other group III metal nitride growth techniques besides HVPE. In a first example, Jiang, et al. [US 2014/0147650, now U.S. Pat. No. 9,589,792] disclosed a process for ammonothermal LEO growth of group-III metal nitrides. However, due to the high reactivity of the ammonothermal environment, application of this method to large-area hetero-substrates or templates places very stringent requirements on the masking material. In a second example, Mori, et al. [US 2014/0328742, now U.S. Pat. No. 9,834,859] disclosed a process for LEO growth of group-III metal nitrides in a sodium-gallium flux. However, in this method the coalescing crystallites typically have prominent semi-polar facets, leading to significant lateral variation in the impurity content of coalesced crystals, and the thermal expansion mismatch between the coalesced nitride layer and a hetero-substrate, which includes a different material than the coalesced nitride layer, may cause uncontrolled cracking.

High quality seed crystals are important to most true bulk crystal growth processes that are used to form group-III metal nitride and gallium based substrates, and large area seed crystals are particularly useful to form group-III metal nitride and gallium based substrates by a method such as ammonothermal growth. However, most large-area gallium nitride crystals are currently grown by [0001]-direction HVPE, as noted above. In addition to the undesirably concentration of threading dislocations typically present in this HVPE formed material, there appears to be a small lattice mismatch between bulk GaN grown by [0001]-direction HVPE versus by other techniques, such as the high-nitrogen-pressure method and MOCVD (Darakchieva et al., *Journal of Crystal Growth*, 2008, Vol. 310, pp. 959-965), on the order of 0.001 Å, corresponding to a strain on the order of $2.5 \times 10^{-4}$. The lattice mismatch between such (0001)-grown HVPE GaN and ammonothermal GaN may be larger, for example, approximately 0.003 Å, corresponding to a strain on the order of $8 \times 10^{-4}$. While these strain levels may sound small, even the smaller value nonetheless corresponds to a Matthews-Blakeslee critical thickness of only about 0.8 micrometer. Above this thickness a bulk-on-HVPE GaN layer structure may reduce its energy by formation of dislocations, if an energetically-accessible mechanism for doing so exists. If energy relaxation by dislocation generation is not possible, in thicker layers relaxation may occur by the formation of cracks. Using the Matthews-Klokholm formulation, the critical thickness upon which cracking may occur is 3-10 micrometers for an ammonothermal film grown on HVPE GaN at 550° C., depending on the actual strain. For example, ammonothermal GaN layers on HVPE GaN seed crystals may form cracks for layers thicker than about 0.1 millimeter, about 0.2 millimeter, thicker than about 0.5 millimeter, thicker than about 1 millimeter, thicker than about 2 millimeters, or thicker than about 5 millimeters. It would be desirable to be able to tune the lattice constant of an HVPE-grown seed crystal to precisely match that of an ammonothermal crystal to be grown upon it, for example, by varying the doping level.

FIGS. 1A-1E are schematic diagrams illustrating process steps within a method for forming a patterned mask seed layer for lateral epitaxial overgrowth that avoids the limitations described above. Referring to FIG. 1A, a substrate 101 is provided with a photoresist layer 103 disposed thereon. Substrate 101 preferably consists of or includes a substrate material that is a single crystal. The substrate 101 can be a commercially available large diameter substrate that consists of or includes a material such as sapphire ($Al_2O_3$), silicon carbide (SiC), silicon, $Mg_2AlO_4$ spinel, $ZrB_2$, among others. One or both of the large-area surfaces of substrate 101 may be polished and/or chemical-mechanically polished. In certain embodiments, substrate 101 consists of or includes sapphire, and has a large-area surface 102 that has a crystallographic orientation within 5 degrees, within 2 degrees, within 1 degree, or within 0.5 degree of (0001), (10-10), (10-12), (22-43), or (11-23). In certain embodiments, substrate 101 consists of or includes sapphire, and has a large-area surface 102 that is misoriented from (0001) by an angle between about 0.5 degree and about 8 degrees, or between about 2 degrees and about 4 degrees, toward the {11-20} a-plane, toward the {10-10} m-plane, or toward a plane intermediate between a-plane and m-plane. In certain embodiments, substrate 101 has a cubic structure and large-area surface 102 has a crystallographic orientation within 5 degrees, within 2 degrees, within 1 degree, or within 0.5 degree of {111}, {100}, {110}, or {114}. Other orientations may also be chosen. Large-area surface 102 may have a maximum lateral dimension between about 5 millimeters and about 600 millimeters and a minimum lateral dimension between about 1 millimeter and about 600 millimeters and substrate 101 may have a thickness between about 10 micrometers and about 10 millimeters, or between about 100 micrometers and about 2 millimeters. In certain embodiments, substrate 101 is substantially circular, with one or more orientation flats. In alternative embodiments, substrate 101 is substantially rectangular. In certain embodiments, large-area surface 102 has a maximum dimension of about 50 mm, 100 mm, 125 mm, 150 mm, 200 mm, 250 mm, or 300 mm. The variation in the crystallographic orientation of the large-area surface 102 may be less than about 5 degrees, less than about 2 degrees, less than about 1 degree, less than about 0.5 degree, less than about 0.2 degree, less than about 0.1 degree, or less than about 0.05 degree.

Substrate 101 may have a surface threading dislocation density less than about $10^7$ $cm^{-2}$, less than about $10^6$ $cm^{-2}$, less than about $10^5$ $cm^{-2}$, less than about $10^4$ $cm^{-2}$, less than about $10^3$ $cm^{-2}$, or less than about $10^2$ $cm^{-2}$. Substrate 101 may have a stacking-fault concentration below about $10^4$ $cm^{-1}$, below about $10^3$ $cm^{-1}$, below about $10^2$ $cm^{-1}$, below about 10 $cm^{-1}$ or below about 1 $cm^{-1}$. Substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters, in at least one, at least two, or in three independent or orthogonal directions.

In alternative embodiments, substrate 101 may consist of or include gallium arsenide, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), $LiGaO_2$, $Ca_8La_2(PO_4)_6O_2$, gallium nitride (GaN), aluminum nitride (AlN), or the like. In certain embodiments, substrate 101 includes a group-III metal nitride layer, a gallium-containing nitride layer, or a gallium nitride layer on a non-nitride substrate such as sapphire, silicon carbide, silicon, or gallium arsenide, hereinafter referred to as a template. The group-III metal nitride layer, a gallium-containing nitride layer, or a gallium nitride layer may be deposited by HVPE, by metalorganic chemical vapor deposition (MOCVD), molecular beam epitaxy (MBE), or the like, according to methods that are known in the art. The group III metal nitride layer may have a thickness between about 1 micrometer and about 1 millimeter, or between about 3 micrometers and about 100 micrometers. In certain embodiments, the group III metal nitride layer has a wurtzite crystal structure and a crystallographic orientation within 5 degrees, within 2 degrees, within 1 degree, or within 0.5 degree of (0001) +c-plane, (000-1) −c-plane, {10–10} m-plane, {11–2±2}, {60–6±1}, {50–5±1}, {40–4±1}, {30–3±1}, {50–5±2}, {70–7±3}, {20–2±1}, {30–3±2}, {40–4±3}, {50–5±4}, {10–1±1}, {1 0 −1±2}, {1 0 −1±3}, {2 1 −3±1}, or {3 0 −3±4}. It will be understood that plane {3 0 −3±4} means the {3 0 −3 4} plane and the {3 0 −3 −4} plane. Large-area surface 102 may have an (h k i l) semipolar orientation, where i=−(h+k) and l and at least one of h and k are nonzero. In certain embodiments, substrate 101 includes group III metal nitride layers, gallium-containing nitride layers, or gallium nitride layers on both the front and back surfaces of a non-nitride substrate. In certain embodiments, substrate 101 includes a group III metal nitride layer, a gallium-containing nitride layer, or a gallium nitride layer on a foreign substrate such as sapphire, silicon carbide, gallium arsenide, silicon, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), LiGaO$_2$, Ca$_8$La$_2$(PO$_4$)$_6$O$_2$, aluminum nitride (AlN), or the like. In one embodiment, the foreign substrate has a coefficient of thermal expansion similar to that of the group-III metal nitride layer, gallium-containing nitride layer, or gallium nitride layer on the foreign substrate.

Figure 1C:
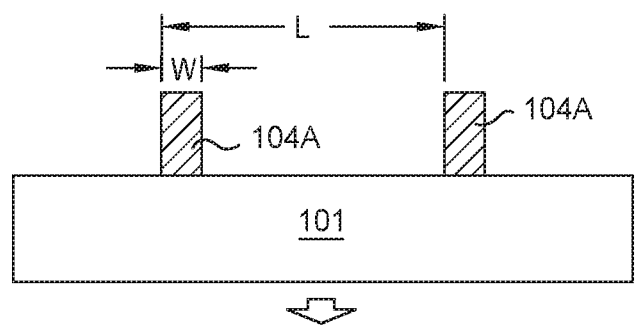

Referring to FIG. 1A, the photoresist layer 103 may be deposited on the large-area surface 102 by methods that are known in the art. For example, in a certain embodiment of a lift-off process, a liquid solution of a negative photoresist is first applied to the large-area surface 102. Substrate 101 is then spun at a high speed (for example, between 1000 to 6000 revolutions per minute for 30 to 60 seconds), resulting in a uniform photoresist layer 103 on the large-area surface 102. Photoresist layer 103 may then be baked (for example, between about 90 and about 120 degrees Celsius) to remove excess photoresist solvent. After baking, the photoresist layer 103 may then be exposed to UV light through a photomask (not shown) to form a patterned photoresist layer 104 (FIG. 1B) having a pre-determined pattern of cross-linked photoresist, such as regions 104A formed within the unexposed regions 104B. The regions 104B of the patterned photoresist layer 104 may form stripes, dots, or other shapes having characteristic width or diameter W and pitch L. The patterned photoresist layer 104 may then be developed to remove non-cross-linked material found in regions 104B and leave regions 104A, such as illustrated in FIG. 1C.

Figure 1D:
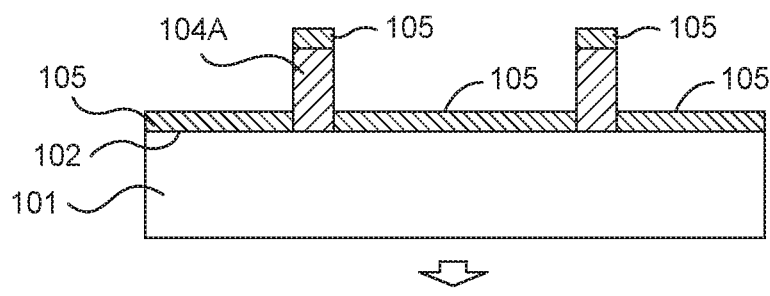
FIGS. 1D and 1E include simplified diagrams illustrating a method of forming a mask layer on a seed crystal or a substrate according to an embodiment of the present disclosure.
Figure 1E:
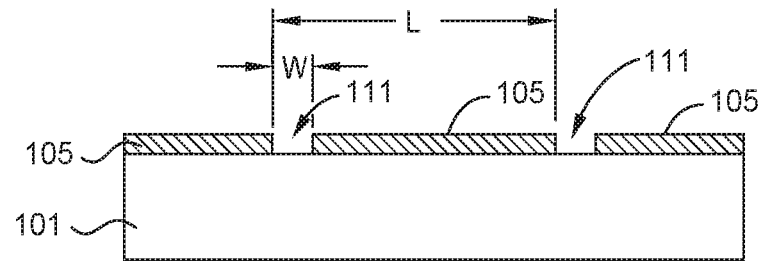

Referring to FIG. 1D, one or more mask layers 105 may be deposited on large-area surface 102 and region 104A of the patterned photoresist layer 104. The one or more mask layers 105 may comprise an inert layer and, optionally, one or more of an adhesion layer (not shown) that is disposed on the large-area surface 102 and a diffusion barrier layer (not shown) disposed between the adhesion layer and the inert layer. The inert layer may face outward from large-area surface 102 and may comprise one or more of SiO$_2$, SiN$_x$, WSiN$_x$, TiN, Au, Ag, Pt, Pd, Rh, Ru, Ir, Ni, Cr, V, Ti, or Ta and may have a thickness between about 10 nanometers and about 100 micrometers. The one or more mask layers 105 may be deposited by plasma-enhanced chemical vapor deposition, sputter deposition, thermal evaporation, electron-beam evaporation, or the like. The adhesion layer, if employed, may be disposed on the large-area surface 102 and may comprise one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$, or the like and may have a thickness between about 1 nanometer and about 1 micrometer. A diffusion-barrier layer, if employed, may comprise one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Pd, Rh, Cr, or the like, and have a thickness between about 1 nanometer and about 10 micrometers. After deposition of the mask layer(s) 105, the portion of the mask layer(s) 105 residing above the regions 104A of patterned photoresist layer 104 (and therefore not in direct contact with substrate 101), as shown in FIG. 1D. The regions 104A and portions of the mask layer 105 disposed thereon are then lifted off along with the patterned photoresist layer 104 by methods that are known in the art to form the openings 111 in the mask layer(s) 105, as shown in FIG. 1E. In certain embodiments, a relatively thin inert layer, for example, 10 to 500 nanometers thick, is deposited prior to the lift-off process. After performing the lift-off process, an additional, thicker inert layer, for example, 5 to 100 micrometers thick, may be deposited over the already-patterned inert layer by electroplating, electroless deposition, or the like. Openings 111 in the mask layer 105 may constitute growth centers during a subsequent growth step (see below).

Other methods besides the lift-off procedure described above may be used to form the patterned mask layer 105, including shadow masking, positive resist reactive ion etching, wet chemical etching, ion milling, laser ablation, and nanoimprint lithography, plus variations of the negative resist lift-off procedure described above. In certain embodiments, a blanket mask layer is deposited over the large-area surface 102, which is then patterned by means of a lithography process that is then followed by wet or dry etching process or by means of laser ablation.

In certain embodiments, patterned mask layer(s) 105 are deposited on both the front and back large-area surfaces 102 of substrate 101.

Figure 1F:
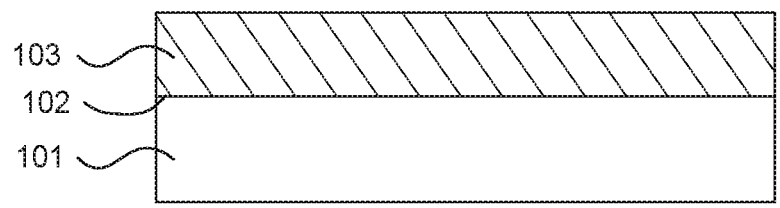
FIGS. 1F, 1G and 1H include simplified diagrams illustrating an alternative method of forming a patterned photoresist layer on a seed crystal or a substrate according to an embodiment of the present disclosure.
Figure 1G:
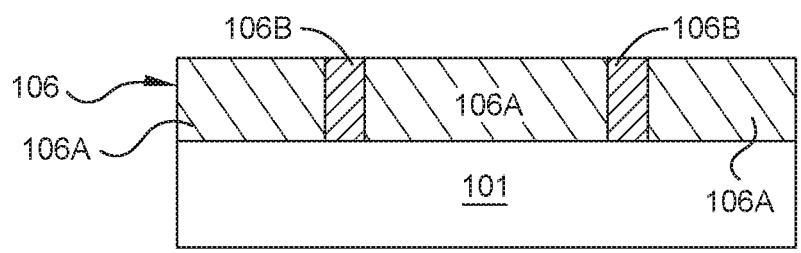
Figure 1H:
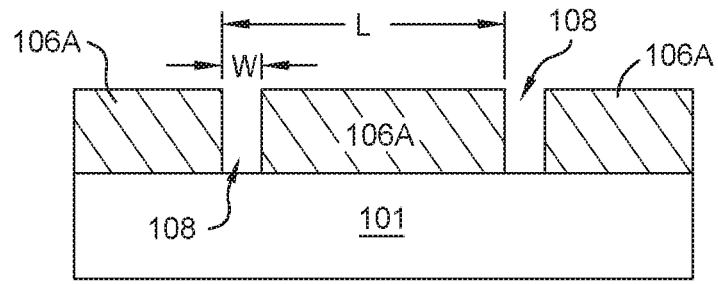

FIGS. 1F-1K are schematic diagrams illustrating process steps within a method for forming a patterned mask layer for lateral epitaxial overgrowth that avoids the limitations described above. In some embodiments, as described below, portions of the large-area surface 102 are removed to form mesas 109 in the substrate 101. Referring to FIGS. 1F-1H, photoresist layer 103 may be deposited onto large-area surface 102 of substrate 101 (FIG. 1F) and exposed to form cross-linked regions 106A and opening regions 106B in a patterned photo resist layer 106 (FIG. 1G). The exposed patterned photo resist layer 106 is then developed and etched, as described above, to form a negative image of the structure shown in FIG. 1A, which includes openings 108 formed in the cross-linked regions 106A, as shown in FIG. 1H.

Figure 1I:
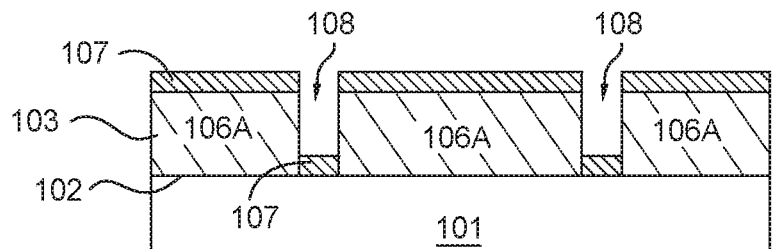
FIGS. 1I, 1J and 1K include simplified diagrams illustrating a method of forming a mesa pattern on a seed crystal or a substrate according to an embodiment of the present disclosure.
Figure 1J:
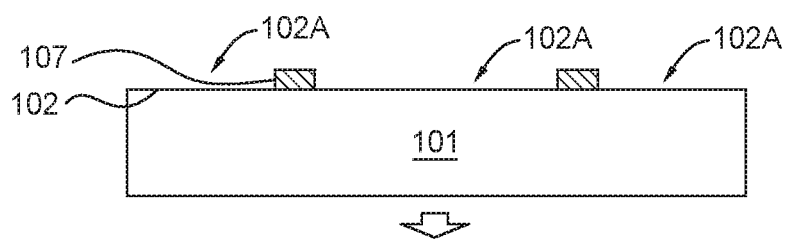
Figure 1K:
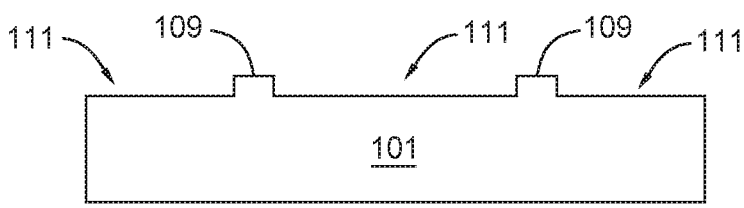

Referring to FIG. 1I, dry-etch mask 107 may then be deposited onto exposed portions of large-area surface 102 formed within openings 108 and onto remaining portions of the cross-linked regions 106A of the original photoresist layer 103. After performing a lift-off process, which removes the cross-linked regions 106A of the original photoresist layer 103, patterned segments of the dry-etch mask 107 remain on the large-area surface 102 (FIG. 1J). Dry-etch mask 107 may comprise Ni, SiO$_2$, or the like. Unmasked regions 102A of the large-area surface 102 may then be dry-etched, for example, by reactive ion etching or by means of an inductively-coupled plasma, using CF$_4$, NF$_3$, Cl$_2$, BCl$_3$, or CH$_2$Cl$_2$ as a reagent gas, to remove portions of the exposed unmasked regions 102A of the large-area surface 102. The dry-etch mask 107 is then removed, for example, by wet etching, to form the mesas 109, as shown in FIG. 1K. The etch depth may be between about 2 micrometers and about 1 millimeter, or between about 5 micrometers and about 100 micrometers. Mesas 109 may be used to form growth centers during a subsequent growth step, which is discussed further below. Another approach for fabricating the mesas 109 on large-area surface 102 of substrate 101 is to use a laser, for example, a CO$_2$ laser, a YAG laser, or a Ti:sapphire laser, to remove the areas between mesas 109. This laser ablation process may be used to generate a variety of patterns and geometries.

Figure 1R:
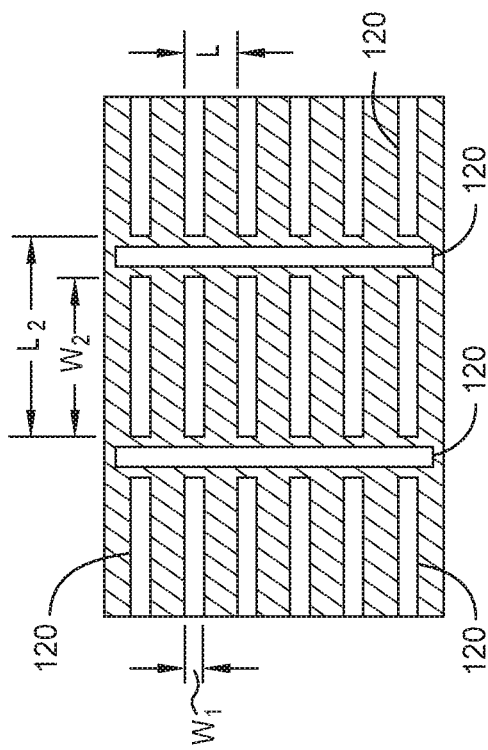
FIGS. 1Q and 1R include top views of arrangements of openings in a patterned mask layer on a seed crystal or a substrate according to an embodiment of the present disclosure.
Figure 1Q:
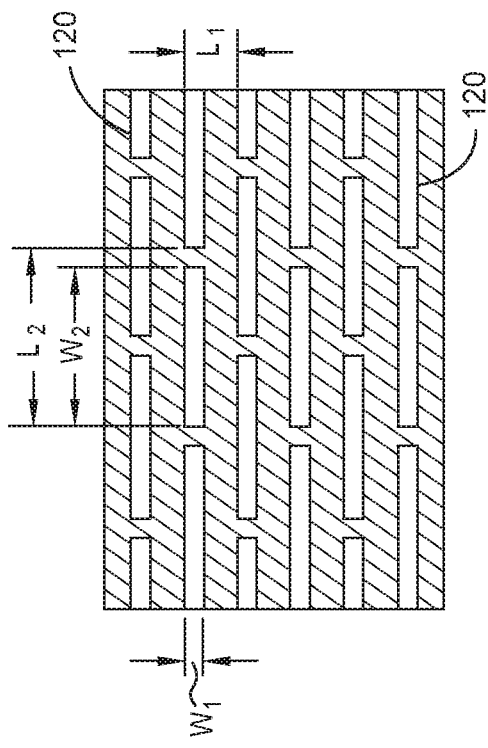

FIGS. 1L-1R illustrate top views of arrangements of exposed regions 120 on the substrate 101 formed by one or more of the processes described above. The exposed regions 120 (or also referred to herein as growth centers), which are illustrated, for example, in FIGS. 1L-1R, may include openings 111 formed in patterned mask layer(s) 105 shown in FIG. 1E, or the mesas 109 shown in FIG. 1K. In certain embodiments, the exposed regions 120 are arranged in a one-dimensional (1D) array in the y-direction, such as a single column of exposed regions 120 as shown in FIG. 1O. In certain embodiments, the exposed regions 120 are arranged in a two-dimensional (2D) array in x- and y-directions, such as illustrated in FIGS. 1L-1N and 1P-1R. The exposed regions 120 may be round, square, rectangular, triangular, hexagonal, or the like, and may have an opening dimension or diameter W between about 1 micrometer and about 5 millimeters, between about 2 micrometers and about 500 micrometers, or between about 5 micrometers and about 50 micrometers, such as illustrated in FIGS. 1L-1O. The exposed regions 120 may be arranged in a 2D hexagonal or square array with a pitch dimension L between about 5 micrometers and about 20 millimeters or between about 200 micrometers and about 5 millimeters, or between about 500 micrometers and about 2 millimeters, such as illustrated in FIGS. 1L-1N. The exposed regions 120 may be arranged in a 2D array, in which the pitch dimension $L_1$ in the y-direction and pitch dimension $L_2$ in the x-direction may be different from one another, as illustrated in FIGS. 1P-1R. The exposed regions 120 may be arranged in a rectangular, parallelogram, hexagonal, or trapezoidal array (not shown), in which the pitch dimensions $L_1$ in the y-direction and $L_2$ in the x-direction may be different from one another. The array of exposed regions 120 may also be linear or irregular shaped. The exposed regions 120 may be placed in registry with the crystal structure of substrate 101. For example, in certain embodiments, large-area surface 102 of substrate 101 has a hexagonal, e.g., a (0001) or (000-1) crystallographic orientation, and the exposed regions 120 comprise a 2D hexagonal array such that the separations between nearest-neighbor exposed regions 120 are parallel to <11-20> or <10-10> directions in large-area surface 102 of the substrate 101. In certain embodiments, large-area surface 102 of substrate 101 is nonpolar or semipolar and the exposed regions 120 comprise a 2D square or rectangular array such that the separations between nearest-neighbor openings are parallel to the projections of two of the c-axis, an m-axis, and an a-axis on large-area surface 102 of substrate 101. In certain embodiments, the pattern of exposed regions 120 is obliquely oriented with respect to the structure of substrate 101, for example, wherein the exposed regions 120 are rotated by between about 1 degree and about 44 degrees with respect to a high-symmetry axis of the substrate, such as a projection of the c-axis, an m-axis, or an a-axis on large-area surface 102 of substrate 101. In certain embodiments, the exposed regions 120 are substantially linear rather than substantially round. In certain embodiments, the exposed regions 120 are slits having a width W and period L that run across the entire length of substrate 101, as illustrated in FIG. 1O. In certain embodiments, the exposed regions 120 are slits that have a width $W_1$ in the y-direction and a predetermined length $W_2$ in the x-direction that is less than the length of substrate 101, and may be arranged in a 2D linear array with period $L_1$ in the y-direction and period $L_2$ in the x-direction, as illustrated in FIG. 1P. In some embodiments, adjacent rows of exposed regions 120 (e.g., slits) may be offset in the x-direction from one another rather than arranged directly adjacent, as shown in FIG. 1Q. In certain embodiments, the adjacent rows of exposed regions 120 (e.g., slits) may be offset in the longitudinal y-direction from one another. In certain embodiments, the exposed regions 120 include slits that extend in the x-direction and slits that extend in the y-direction, as shown in FIG. 1R. In other embodiments, the exposed regions 120 include slits that extend in directions that are rotated from one another by 60 degrees or a multiple thereof.

Figure 2:
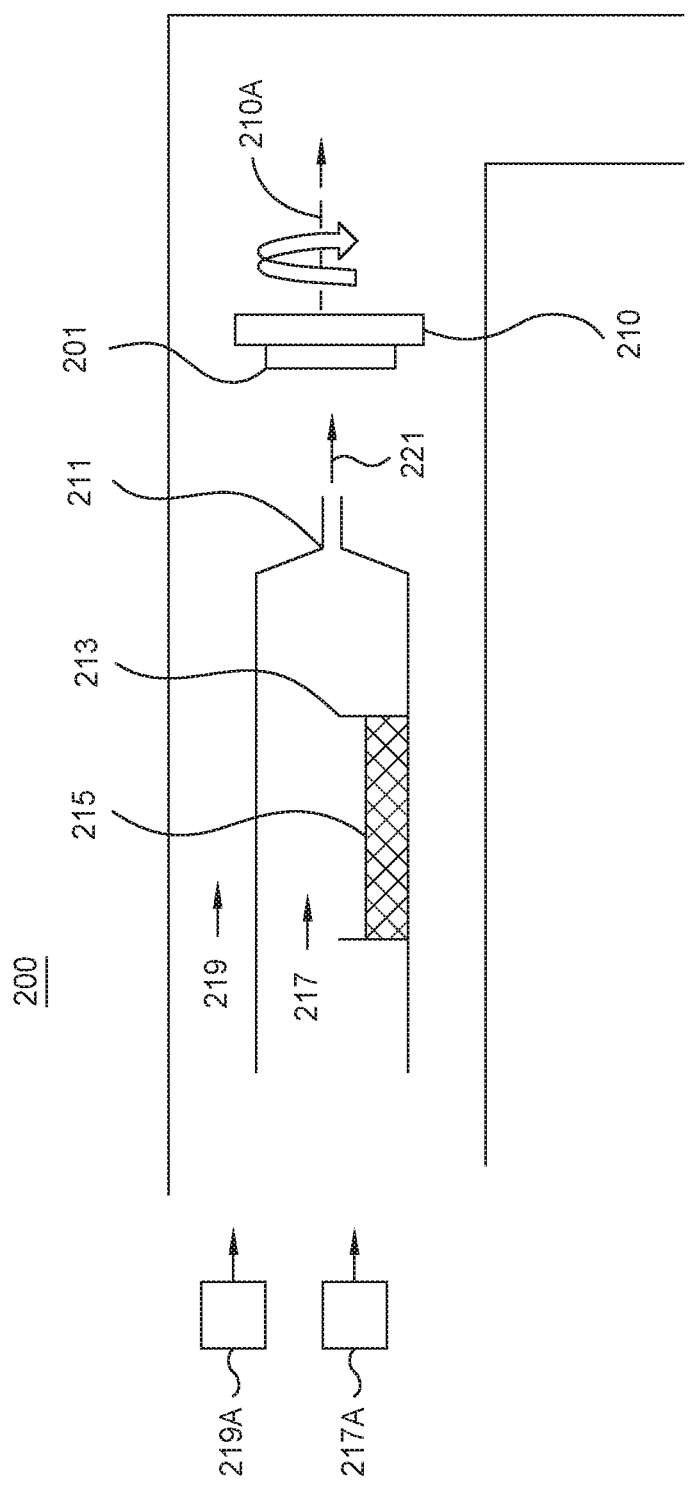
FIG. 2 is a simplified diagram illustrating a hydride vapor phase epitaxy (HVPE) reactor for processing one or more substrates according to an embodiment of the present disclosure.

FIG. 2 is a simplified diagram illustrating a hydride vapor phase epitaxy (HVPE) reactor 200. Within the HVPE reactor 200, one or more substrates 201 may be placed on a susceptor 210 provided with one or more recessed portions (not shown) so that the outward-facing surfaces of one or more substrates 201 may be approximately flush with respect to the outward-facing surface of susceptor 210.

In the HVPE reactor 200, at least one group III metal source 211 is provided. Group III metal source 211 may comprise a crucible 213 which contains a group III metal 215. Group III metal 215 may comprise at least one of gallium, aluminum, and indium. Group III metal 215 may further comprise at least one dopant precursor, such as Si, Ge, Mg, Fe, Mn, or Co. Halogen-containing gas 217 provided from a source 217A is passed over group III metal 215. Halogen-containing gas 217 may comprise $X_2$ or HX, where X is F, Cl, Br, or I. In a preferred embodiment, halogen-containing gas 217 comprises HCl or $Cl_2$. Halogen-containing gas 217 may further comprise a carrier gas, such as at least one of hydrogen, helium, neon, argon, krypton, xenon, or nitrogen. In certain embodiments, halogen-containing gas 217 further comprises one or more dopant precursors, such as $SiCl_4$, $SiH_2Cl_2$, or $GeCl_4$. In certain embodiments, the dopant precursor is contained in a separate source, with a separate halogen-containing gas flowing through it, rather than being combined with the group III metal 215.

Nitrogen-containing gas 219 provided from a source 219A is mixed with the effluent gases 221 from group III metal source 211, respectively. In a preferred embodiment, nitrogen-containing gas 219 comprises ammonia. Nitrogen-containing gas 219 may further comprise a carrier gas, such as at least one of hydrogen, helium, neon, argon, krypton, xenon, or nitrogen. Nitrogen-containing gas 219 may further comprise at least one dopant precursor, such as $O_2$, $H_2O$, $SiH_4$, $GeH_4$, $Mg(cp)_2$, $CH_4$, or $Fe(cp)_2$ [cp=cyclopentadienyl, $C_5H_5$].

HVPE reactor 200 may further be provided with temperature-controlled heating sources (not shown) for susceptor 210 and group III metal source 211. Susceptor 210 may rotate about an axis 210A, for example, to improve uniformity. In certain embodiments, HVPE reactor 200 has a horizontal orientation and the one or more substrates 201 have a vertical orientation, as shown in FIG. 2. In certain embodiments, HVPE reactor 200 has a horizontal orientation and the one or more substrates 201 have a horizontal orientation. In certain other embodiments, HVPE reactor 200 has a vertical orientation and the one or more substrates 201 have a horizontal orientation, either upward-facing or downward-facing, and the outlet of group III metal source 211 is directed toward the surface(s) of the one or more substrates 201. The absolute rate of deposition of group III metal nitride, and the relative growth rates in different crystallographic directions, may be adjusted by setting the temperature of the group III metal source, the flow rate and mole fraction of halogen-containing gases over the group III metal, the flow of nitrogen-containing gas, the ratio of the nitrogen-containing species over the group III metal species provided to a surface of a substrate of the one or more substrates 201, the reactor pressure, and the substrate temperature, each of which may be set to pre-determined values. The pressure at which the HVPE is performed may be below about 1 Torr, between about 1 Torr and about 10 Torr, between about 10 Torr and about 100 Torr, between about 100 Torr and about 790 Torr, between about 1 atmosphere and about 2 atmospheres, or above about two atmospheres. The total gas flow rate may be between about 0.1 and about 100 standard liters per minute, or between about 0.5 and about 30 standard liters per minute.

FIGS. 3A-3I are simplified diagrams illustrating various epitaxial lateral overgrowth processes used to form a large-area group III metal nitride crystal. While the discussion below primarily discusses the use of openings 111 formed in a patterned mask layer 105 this processing configuration is not intended to be limiting as to the scope of the disclosure provided herein since other forms of the exposed regions 120 (FIGS. 1L-1R), which are formed by other techniques, may be used. Referring to FIG. 3A, a group III metal nitride material 301 is caused to grow vertically from a seed interface surface 111A and through openings in mask layer 105 on substrate 101 under a first set of HVPE growth conditions. For example, a suitable first set of HVPE growth conditions may include a group III metal source temperature between about 800 degrees Celsius and about 1050 degrees Celsius, a substrate temperature between about 1025 degrees Celsius and about 1075 degrees Celsius, a ratio of the flow rates of ammonia and halogen-containing gas between about 0.5 and about 50, a carrier gas flow rate between 1× and 10× the flow rate of ammonia, and a reactor pressure between about 0.8 and about 1.1 atmosphere. Optionally, prior to growth of vertically-grown group III metal nitride material 301, group III metal nitride is first nucleated on substrate 101 under a nucleation condition. In certain embodiments, a nucleation process is performed to achieve (000-1)-oriented group III metal nitride material. For example, substrate 101 may first be exposed to flowing ammonia at a temperature of approximately 1050 degrees Celsius for approximately 10 minutes prior to introduction of gas flow into the group III metal source, thereby initiating nucleation of (000-1)-oriented group III metal nitride. $N_2$ may be preferred as a carrier gas, rather than $H_2$, during the nucleation and initial growth process. In some embodiments, as described above, substrate 101 comprises a template, with a pre-deposited, outward-facing group III metal nitride layer, and the nucleation step is not needed. In certain embodiments, the group III metal nitride layer on the template has a (0001), Ga-face orientation and group III metal nitride material 301 grows in the [0001] direction. In certain preferred embodiments, the group III metal nitride layer on the template has a (000-1), nitrogen face (N-face) orientation and group III metal nitride material 301 grows in the [0001] direction. Threading dislocations 303 may be present in vertically-grown group III metal nitride material 301, for example, at a concentration between about $10^6$ or $10^7$ cm$^{-2}$ to about $10^9$ cm$^{-2}$ Referring to FIG. 3B, after the vertically-grown group III metal nitride material 301 has been grown such that it protrudes through mask layer 105 by a distance between about 1 micrometer and about 5 millimeters, or between about 5 micrometers and about 1 millimeter, one or more process parameters may be changed, to a second set of HVPE growth conditions that favor lateral growth relative to vertical growth. For example, the growth pressure may be reduced from approximately 1 atmosphere to a value between about 0.01 and about 0.7 atmosphere, or between about 0.1 and about 0.5 atmosphere. The ratio of the flow rates of ammonia and halogen-containing gas may by increased by a factor between about 1.2× and about 10×. The flow of halogen-containing gas may be pulsed rather than being held at a constant value. The temperature of one or both of susceptor 210 and group III metal source 211 may be changed to favor lateral growth over vertical growth. Following the change to the second set of HVPE growth conditions, laterally-grown wings 307 begin to form or become more prominent, if present even during the first set of HVPE growth conditions.

Referring to FIG. 3C, as growth continues under the second set of HVPE growth conditions, lateral growth of laterally-grown wings 307 continues until adjacent laterally-grown wings 307 coalesce at coalescence fronts 319. After coalescence, the laterally-grown group III metal nitride layer 309 comprises window regions 315, which have grown vertically with respect to the seed interface surface 111A in the openings 111 in the patterned mask layer 105, wing regions 317, which have grown laterally over patterned mask layer 105, and coalescence fronts 319, which are boundaries between adjacent wing regions 317 growing from adjacent openings 111 in patterned mask layer 105. The concentration of threading dislocations 303 in window regions 315 may be between about $10^4$ cm$^{-2}$ and about $10^9$ cm$^{-2}$, or between about $10^5$ cm$^{-2}$ and about $10^8$ cm$^{-2}$. Window regions 315 may have a minimum lateral dimension between about 1 micrometer and about 200 micrometers or between about 2 micrometers and about 100 micrometers or between about 5 micrometers and about 50 micrometers. The concentration of threading dislocations may be significantly less in wing regions 317 than in window regions 315, for example, having a value of between about $10^3$ cm$^{-2}$ and about $10^6$ cm$^{-2}$. Air gaps 321 may lie between mask layer 105 and laterally-grown group III metal nitride layer 309 and have a maximum gap thickness 331 between about 25 micrometers and about 5 millimeters or between about 100 micrometers and about 1 millimeter. Optionally, after coalescence of the laterally-grown wing regions 307, one or more process parameters may be changed, to a third set of HVPE growth conditions, that favor vertical growth relative to lateral growth. In some embodiments, the third set of HVPE growth conditions is similar or identical to the first set of HVPE growth conditions. In certain embodiments, coalescence of the laterally-grown wing regions 307 is incomplete, that is, some through-holes (not shown) remain in laterally-grown group III metal nitride layer 309. Such through-holes would be problematic for utilization of the laterally-grown layer to fabricate wafers for semiconductor manufacturing but the through-holes may be useful for separation of the laterally-grown layer from substrate 101 and may be inconsequential or desirable for utilization of the laterally-grown layer as a seed crystal for a separate subsequent crystal growth process, for example, by the ammonothermal method. The laterally-grown group III metal nitride layer 309 may have a minimum thickness 335 that is between about 10 micrometers and about 10 millimeters, or between about 100 micrometers and about 2 millimeters. The thickness 335 of the laterally grown group III metal nitride layer 309 can be measured between a lower crystal surface 332 and a top growth surface 333, for example, at the coalescence front 319. In illustrated in FIG. 3C, the seed interface surface 111A in the openings 111 is disposed a distance in the vertical direction (e.g., Z-direction) from the lower crystal surface 332 at the coalescence fronts 319. In this example, the distance (or interface surface distance) is equal to vertical distance found in the gap 331 plus the thickness of the patterned mask layer 105. The coalescence fronts 319 may include a coalescence front region that includes a "sharp boundary" that has a width of less than about 25 micrometers or less than about 10 micrometers that is disposed between adjacent wing regions 317 and extends through the thickness 335 in the z-direction, or an "extended boundary" that has a width between about 25 micrometers and about 1000 micrometers or between about 30 micrometers and about 250 micrometers that is disposed between adjacent wing regions 317 and extends through the thickness 335 in the z-direction, depending on the growth conditions. The sharp boundary type of formed coalescence front regions include sets of threading dislocations that extend substantially vertically through the formed crystal, and the extended boundary type of formed coalescence front regions include sets of threading dislocations that tend to extend along a path that laterally meanders as the coalescent front extends vertically through the grown crystal. In certain embodiments the extended boundary type of formed coalescence fronts includes three or more locally-approximately-linear arrays of threading dislocations adjacent to one another.

FIGS. 3D-3F shows an analogous sequence for formation of a laterally-grown group III metal nitride layer 309 where the starting substrate 101 comprises a mesa-etched substrate similar to that shown in FIG. 1K rather than a masked substrate similar to that shown in FIG. 1E. One or more patterned mask layers 105 (not shown in FIG. 3D) may be present between mesas 109 to inhibit growth on the lower regions of the large-area surface 102 disposed between mesas 109. In another embodiment, one or more patterned mask layers 105 (not shown in FIG. 3D) may be formed on the sidewalls of the mesas 109 along with regions between mesas 109 to inhibit growth and promote growth to occur primarily on the top surfaces of the mesas 109. Patterned mask layers 105 may have a thickness between about 20 nanometers and about 20 micrometers, or between about 0.5 micrometer and about 5 micrometers. However, in either case, the laterally-grown group III metal nitride layer 309 comprises window regions 315, which have grown vertically with respect to the seed interface surface 109A of the mesas 109. The thickness 335 of the laterally grown group III metal nitride layer 309 can be measured between a lower crystal surface 332 and a top growth surface 333, for example, at the coalescence front 319. In illustrated in FIG. 3F, the seed interface surface 109A of the mesas 109 is disposed a distance in the vertical direction (e.g., the z-direction) from the lower crystal surface 332 at the coalescence fronts 319. In this example, the distance (or mesa surface distance) is equal to the vertical distance formed between the lower crystal surface 332 at the coalescence fronts 319 and the seed interface surface 109A.

FIGS. 3G-3I shows a variation of the process illustrated schematically in FIG. 3A-3C, where the growth front 305 of the group III metal nitride material (also referred to as "narrow growth columns") 301 is non-planar, for example, because of the formation of semi-polar facets such as (10-11) or (10-1-1). In this case, threading dislocations 303 may deviate significantly from vertical-grown group III metal nitride material 301 shown in FIGS. 3A-3C and 3D-3F, reducing their concentration directly above the openings 111 of the patterned mask layer 105, but potentially increasing their concentration in the laterally-grown group III metal nitride layer 309. The thickness 335 of the laterally grown group III metal nitride layer 309 can be measured between a lower crystal surface 332 and a top growth surface 333 at the coalescence front 319. In illustrated in FIG. 3I, the seed interface surface 111A of the openings 111 is disposed a distance in the vertical direction from the lower crystal surface 332 at the coalescence fronts 319. In this example, the distance (or interface surface distance) is equal to the vertical distance formed between the lower crystal surface 332 at the coalescence fronts 319 and the seed interface surface 111A. In this example, the distance (or interface surface distance) is equal to vertical distance formed found in the gap 331 plus the thickness of the patterned mask layer 105.

After growth of the laterally-grown group III metal nitride layer 309 is complete, the flow of the halogen-containing gas is stopped and the substrate 101 is cooled, at a rate between about one degree Celsius per second and about 5 degrees Celsius per hour. In certain embodiments, a difference in thermal expansion coefficient between laterally-grown group III metal nitride layer 309 and substrate 101 may cause generation of stress, which may cause facture at interfaces between the two and spontaneous self-separation. By choice of small lateral dimensions of mask openings ("W" in FIGS. 1E, 1H, and 1L-1O, "$W_1$" and "$W_2$" in FIGS. 1P-1R) or mesas, creating narrow growth columns 301, relatively large pitches, relatively large air gaps 321, and optimizing the cooling rate, cracking and fracture may be limited to narrow growth columns 301 rather than the separated laterally-grown group III metal nitride layer 309. For example, at their narrowest points, narrow growth columns 301 may have a lateral dimension between about 1 micrometer and about 200 micrometers or between about 5 micrometers and about 50 micrometers. The pitch ("L" in FIGS. 1E, 1H and 1L-1O, "$L_1$" and "$L_2$" in FIGS. 1P-1R) may be between about 20 micrometers and about 5 millimeters, or between about 50 micrometers and about 2 millimeters. Air gaps 321 may have a maximum gap thickness 331 between about 50 micrometers and about 1 millimeter, with the overall effect of making narrow growth columns 301 relatively fragile and offering an easy separation path.

In addition to providing for facile self-separation between a newly-grown group III metal nitride layer and a substrate, this method provides several additional benefits. In certain preferred embodiments, the narrow growth columns 301 are relatively high and the air gaps 321 relatively large, implying that the nucleated group metal nitride islands grow in isolation to a significant crystal thickness, for example, greater than 25 micrometers or greater than 100 micrometers, before coalescing. It is well known that the concentration of threading dislocations in group III metal nitride layers diminishes with thickness, due mainly to annihilation of dislocations having opposite-signed Burgers vectors, producing stress and strain. See, for example, S. K. Mathis, et al., *Journal of Crystal Growth*, 2001, Vol. 231, pp. 371-390. It is much easier for the growing layer to accommodate the strain when the dislocation reduction process occurs within isolated islands than when the process occurs within a contiguous film. The method of Mori, et. al. (U.S. Pat. No. 9,834,859) also has this advantageous feature. Further, in certain preferred embodiments, the growth front 305 is planar, as shown schematically in FIGS. 3C and 3F, with the consequence that the impurity concentration is quite uniform across the surface, implying a uniform lattice constant and a minimum in additional stress. As noted previously, the method of Mori, et al. does not have this feature; rather, prominent semipolar facets are typically present, accompanied by significant lateral variations in impurity concentration. Still further, in certain preferred embodiments, the crystallographic orientation of the growth front is (000-1), enabling ready incorporation of a wide variety of dopants, such as O, Si, Ge, Mg, Fe, Mn, Co, or C, and fine-tuning of the lattice constant of the laterally-grown group III nitride boule or wafer to that of group III nitride material grown by another method, such as ammonothermal, enable superior performance as a seed crystal.

In certain embodiments, substrate 101 is separated from the laterally-grown group III metal nitride layer 309 by a method other than spontaneous self-separation. Removal of substrate 101 may be alternatively accomplished by one or more of sawing, grinding, lapping, polishing, laser lift-off, and etching. In certain embodiments, substrate 101 comprises a different composition than the laterally-grown group III metal nitride layer, such as sapphire, silicon, or gallium arsenide. In such a case, substrate 101 may be removed using process conditions that preferentially etch substrate 101 while producing little or no etching of the laterally-grown group III metal nitride layer. In other embodiments, substrate 101 comprises a similar or essentially identical composition as the laterally-grown group III metal nitride layer and separation may be performed by wire sawing.

In certain embodiments, laterally-grown group III metal nitride layer 309 is subjected to one or more processes, such as at least one of sawing, lapping, grinding, polishing, chemical-mechanical polishing, or etching.

In certain embodiments, the concentration of extended defects, such as threading dislocations and stacking faults, in the laterally-grown group III metal nitride layer 309 may be quantified by defect selective etching, either before or after separation from substrate 101. Defect-selective etching may be performed, for example, using a solution comprising one or more of $H_3PO_4$, $H_3PO_4$ that has been conditioned by prolonged heat treatment to form polyphosphoric acid, and $H_2SO_4$, or a molten flux comprising one or more of NaOH and KOH. Defect-selective etching may be performed at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, then removing the laterally-grown group III metal nitride layer, crystal, or wafer from the etchant solution.

The concentration of threading dislocations in the surface of the window regions 315 may be similar to that in the originally-underlying substrate 101 or less, by as much as approximately four orders of magnitude. The concentration of threading dislocations in the surface of wing regions 317 may be lower, by about one to about three orders of magnitude, than the concentration of threading dislocations in the surface of the window regions 315, and may be below about $10^3$ cm$^{-2}$, below about $10^2$ cm$^{-2}$, or below about 10 cm$^{-2}$. Some stacking faults, for example, at a concentration between about 1 cm$^{-2}$ and about $10^4$ cm$^{-2}$, may be present at the surface of the window regions 315. The concentration of stacking faults in the surface of wing regions 317 may be lower, by about one to about three orders of magnitude, than the concentration of stacking faults in the surface of the window regions 315, and may be below about $10^2$ cm$^{-2}$, below about 10 cm$^{-2}$, below about 1 cm$^{-2}$, or below about 0.1 cm$^{-2}$, or may be undetectable. Threading dislocations, for example, edge dislocations, may be present at coalescence fronts 319, for example, with a line density that is less than about $1 \times 10^5$ cm$^{-1}$, less than about $3 \times 10^4$ cm$^{-1}$, less than about $1 \times 10^4$ cm$^{-1}$, less than about $3 \times 10^3$ cm$^{-1}$, less than about $1 \times 10^3$ cm$^{-1}$, less than about $3 \times 10^2$ cm$^{-1}$, or less than $1 \times 10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

In certain embodiments, the process of masking, lateral HVPE growth, and separation from the substrate is repeated one, two, three, or more times.

Figure 4A:
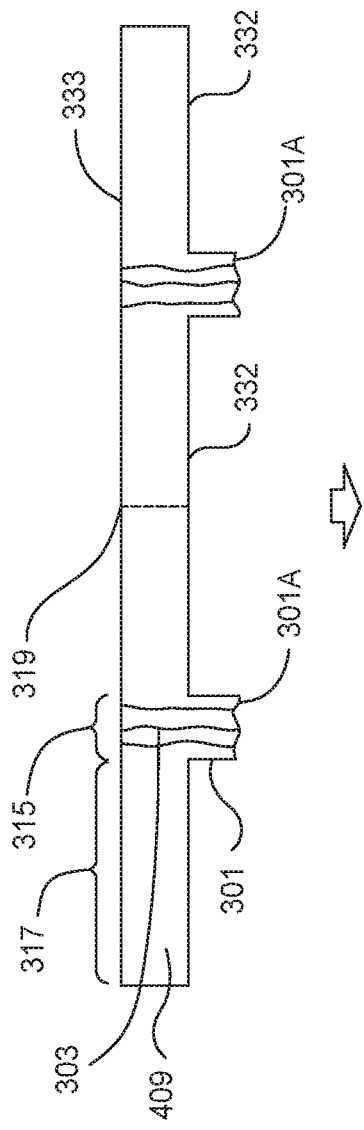
FIGS. 4A, 4B and 4C are simplified diagrams illustrating a method of forming a free-standing group III metal nitride boule and free-standing group III metal nitride wafers.
Figure 4B:
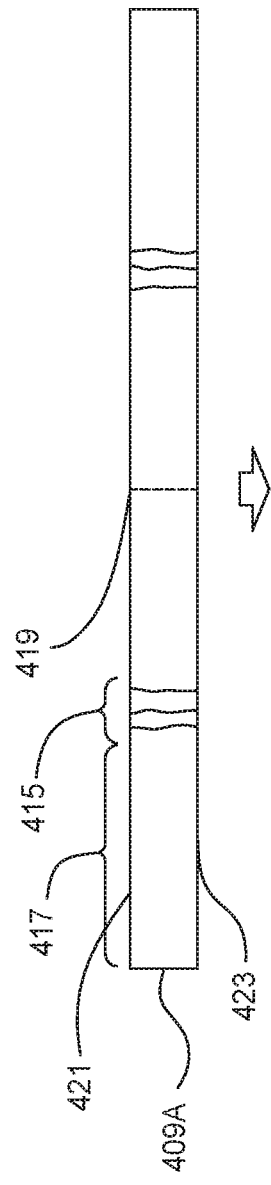
Figure 4C:
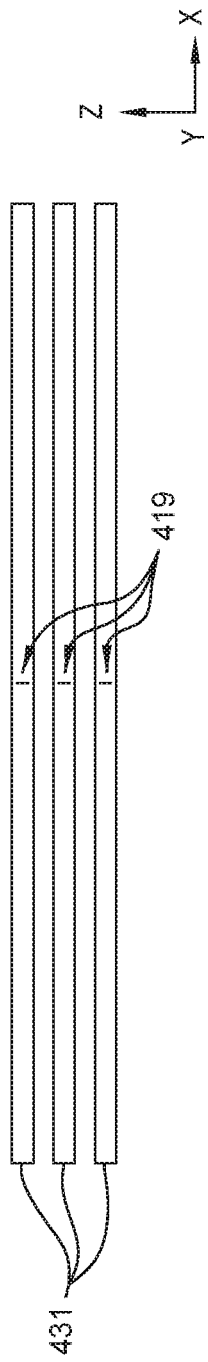

FIGS. 4A-4C are simplified diagrams illustrating a method of forming a free-standing group III metal nitride boule and free-standing group III metal nitride wafers. The initially separated free-standing group III metal nitride boule 409 (or group III metal nitride crystal body) may include a plurality of regions of vertically-grown group III metal nitride material 301 that each include a freestanding interface surface 301A (FIG. 4A), which is formed by separating the laterally grown group III metal nitride layer 309 from the seed interface surface of an exposed region 120 of the substrate 101. The freestanding interface surface 301A may be disposed a distance in the vertical direction from the lower crystal surface 332 at the coalescence fronts 319. The distance in the vertical direction (z-direction) from the freestanding interface surface 301A to the lower crystal surface 332 may vary depending whether the process of separating the laterally grown group III metal nitride layer 309 from the substrate 101 cause the crystal to detach from the substrate 101 at the seed interface surface 109A, 111A or at a separating process fracture point within the vertically-grown group III metal nitride material 301. In certain embodiments, free-standing laterally-grown group III metal nitride boule 409 (FIG. 4A) is subjected to one or more processes, such as at least one of sawing, lapping, grinding, polishing, chemical-mechanical polishing, or etching to form a processed free-standing laterally-grown group III metal nitride boule 409A (FIG. 4B). The processed free-standing laterally-grown group III metal nitride boule 409A may include one or more window regions 415 that were formed above exposed regions 120, such as openings 111 in patterned mask layer(s) 105, on a substrate 101. The processed free-standing laterally-grown group III metal nitride boule 409A may also include, for example, one or more wing regions 417 that were formed above non-open regions in patterned mask layer(s) 105 (FIG. 3C), and one or more coalescence fronts 419. One or more of front surface 421 and back surface 423 of free-standing laterally-grown group III metal nitride boule 409 may be subjected to additional processing, such as at least one of lapping, polishing, etching, and chemical-mechanically polishing. As similarly discussed above, the coalescence fronts 419 may include a coalescence front region that includes a "sharp boundary" that has a width less than about 25 micrometers or less than about 10 micrometers that is disposed between the adjacent wing regions 417, or an "extended boundary" that has a width between about 25 micrometers and about 1000 micrometers or between about 30 micrometers and about 250 micrometers that is disposed between the adjacent wing regions 417, depending on the growth conditions.

In certain embodiments, the edge of free-standing laterally-grown group III metal nitride boule 409 is ground to form a cylindrically-shaped laterally-grown group III metal nitride boule. In certain embodiments, one or more orientation flats, which are oriented to a desired crystal plane, is ground into the side of free-standing laterally-grown group III metal nitride boule 409. As is illustrated in FIG. 4C, in certain embodiments, free-standing laterally-grown group III metal nitride boule 409 is sliced into one or more free-standing laterally-grown group III metal nitride wafers 431. The slicing may be performed by multi-wire sawing, multi-wire slurry sawing, slicing, inner-diameter sawing, outer-diameter sawing, cleaving, ion implantation followed by exfoliation, laser cutting, or the like. One or more large-area surfaces of free-standing laterally-grown group III metal nitride wafers 431 may be ground, lapped, polished, etched, electrochemically polished, photoelectrochemically polished, reactive-ion-etched, and/or chemical-mechanically polished according to methods that are known in the art. In certain embodiments, a chamfer, bevel, or rounded edge is ground into the edges of free-standing laterally-grown group III metal nitride wafers 431. The free-standing laterally-grown group III metal nitride wafers 431 may have a diameter of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters and may have a thickness between about 50 micrometers and about 10 millimeters or between about 150 micrometers and about 1 millimeter. One or more large-area surface of free-standing laterally-grown group III metal nitride wafers 431 may be used as a substrate or seed crystal for group III metal nitride growth by chemical vapor deposition, metalorganic chemical vapor deposition, hydride vapor phase epitaxy, molecular beam epitaxy, flux growth, solution growth, ammonothermal growth, among others, or the like.

FIGS. 5A-5E are simplified diagrams illustrating threading dislocation patterns formed in a free-standing group III metal nitride boule 409 or wafer 431. The large-area surfaces of the free-standing laterally-grown group III metal nitride boule 409 or wafer 431 may be characterized by a pattern 502 of locally-approximately-linear arrays of threading dislocations that propagated from coalescence fronts 319 formed during the epitaxial lateral overgrowth process as discussed above in conjunction with FIGS. 3A-3I, and 4A-4C. The pattern 502 of locally-approximately-linear arrays of threading dislocations may be 2D hexagonal, square, rectangular, trapezoidal, triangular, 1D linear, or an irregular pattern that is formed at least partially due to the pattern of the exposed regions 120 (FIGS. 1L-1R) used to form free-standing laterally-grown group III metal nitride boule 409 during the processes used to form the boule. One or more window regions 506 are formed above the exposed regions 120 (FIGS. 1L-1R), and one or more wing regions 508 are formed on portions that are not above the exposed regions 120, that is, were formed by lateral growth. As discussed above, the formed coalescence fronts 319 may include coalescence front regions that have a lateral width (i.e., measured parallel to the surface of the page containing FIGS. 5A-5E) that can vary depending on the growth conditions.

More complex patterns are also possible and may be advantageous, for example, in being more resistant to cracking or cleaving. The pattern 502 may be elongated in one direction compared to another orthogonal direction, for example, due to the free-standing laterally-grown group III metal nitride boule 409 being sliced at an inclined angle relative to the large-area surface of a free-standing laterally-grown group III metal nitride boule 409. In some embodiments, one or more through-holes 504 (FIG. 5A) are present in the laterally-grown group III metal nitride boule 409 or wafer 431 at the termination of one or more locally-approximately-linear arrays of threading dislocations. The pattern 502 of locally-approximately-linear arrays of threading dislocations may be characterized by a linear array of threading dislocations (FIG. 5D) that have a pitch dimension L between about 5 micrometers and about 20 millimeters or between about 200 micrometers and about 5 millimeters, or between about 500 micrometers and about 2 millimeters. The pattern 502 of locally-approximately-linear arrays of threading dislocations may be characterized by a pitch dimension L (FIGS. 5A, 5B), or by pitch dimensions $L_1$ and $L_2$ in two orthogonal directions (FIGS. 5C and 5E), between about 5 micrometers and about 20 millimeters or between about 200 micrometers and about 5 millimeters, or between about 500 micrometers and about 2 millimeters. In certain embodiments, the pattern 502 of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of one or more of <1 0-1 0>, <1 1-2 0>, or [0 0 0±1] or their projections in the plane of the surface of the free-standing laterally-grown group III metal nitride boule 409 or wafer 431. The linear concentration of threading dislocations in the pattern may be less than about $1 \times 10^5$ $cm^{-1}$, less than about $3 \times 10^4$ $cm^{-1}$, less than about $1 \times 10^4$ $cm^{-1}$, less than about $3 \times 10^3$ $cm^{-1}$, less than about $1 \times 10^3$ $cm^{-1}$, less than about $3 \times 10^2$ $cm^{-1}$, or less than about $1 \times 10^2$ $cm^{-1}$. The linear concentration of threading dislocations in the pattern 502 may be greater than 5 $cm^{-1}$, greater than 10 $cm^{-1}$, greater than 20 $cm^{-1}$, greater than 50 $cm^{-1}$, greater than 100 $cm^{-1}$, greater than 200 $cm^{-1}$, or greater than 500 $cm^{-1}$.

The concentration of threading dislocations in the wing regions 508 between the locally-approximately-linear arrays of threading dislocations may be below about $10^5$ $cm^{-2}$, below about $10^4$ $cm^{-2}$, below about $10^3$ $cm^{-2}$, below about $10^2$ $cm^{-1}$, or below about 10 $cm^{-2}$. The concentration of threading dislocations, averaged over a large-area surface of the free-standing laterally-grown group III metal nitride boule 409 or wafer 431, may be below about $10^8$ $cm^{-2}$, below about $10^7$ $cm^{-2}$, below about $10^6$ $cm^{-2}$, below about $10^5$ $cm^{-2}$, below about $10^4$ $cm^{-2}$, below about $10^3$ $cm^{-2}$, or below about $10^2$ $cm^{-1}$. The concentration of stacking faults, averaged over a large-area surface of the free-standing laterally-grown group III nitride boule or wafer, may be below about $10^3$ $cm^{-1}$, below about $10^2$ $cm^{-1}$, below about 10 $cm^{-1}$, below about 1 $cm^{-1}$, or below about 0.1 $cm^{-1}$, or may be undetectable. In some embodiments, for example, after repeated re-growth on a seed crystal with a patterned array of dislocations and/or growth to a thickness greater than 2 millimeters, greater than 3 millimeters, greater than 5 millimeters, or greater than 10 millimeters, the positions of the threading dislocations may be displaced laterally to some extent with respect to the pattern on the seed crystal. In such a case the regions with a higher concentration of threading dislocations may be somewhat more diffuse than the relatively sharp lines illustrated schematically in FIGS. 5A-5E. However, the concentration of threading dislocations as a function of lateral position along a line on the surface will vary periodically, with a period between about 5 micrometers and about 20 millimeters or between about 200 micrometers and about 5 millimeters, or between about 500 micrometers and about 2 millimeters. The concentration of threading dislocations within the periodically-varying region may vary by at least a factor of two, at least a factor of 5, at least a factor of 10, at least a factor of 30, at least a factor of 100, at least a factor of 300, or at least a factor of 1000.

Referring again to FIG. 5A-5E, window regions 506 may be positioned between adjacent wing regions 508 (FIG. 5D) or within a single wing region 508 (FIGS. 5A-5C, and 5E). The window regions 506 are formed over the exposed regions 120 formed within the patterned mask layer(s) 105, as generally discussed above in conjunction with FIGS. 1L-1R. The concentration of threading dislocations in the surface of wing regions 508 may be lower, by about zero to about three orders of magnitude, than the concentration of threading dislocations in the surface of the window regions 506, and may be below about $10^6$ $cm^{-2}$, below about $10^5$ $cm^{-2}$, below about $10^4$ $cm^{-2}$, below about $10^3$ $cm^{-2}$, below about $10^2$ $cm^{-2}$, or below about 10 $cm^{-2}$. Some stacking faults, for example, at a concentration between about 1 $cm^{-2}$ and about $10^4$ $cm^{-2}$, may be present at the surface of the window regions 506. The concentration of stacking faults in the surface of wing regions 508 may be lower, by about zero to about three orders of magnitude, than the concentration of stacking faults in the surface of the window regions 506, and may be below about $10^2$ cm$^{-2}$, below about 10 cm$^{-2}$, below about 1 cm$^{-2}$, or below about 0.1 cm$^{-2}$, or may be undetectable. Threading dislocations, for example, edge dislocations, may be present at coalescence front patterns 502, for example, with a line density that is less than about $1 \times 10^5$ cm$^{-2}$, less than about $3 \times 10^4$ cm$^{-1}$, less than about $1 \times 10^4$ cm$^{-2}$, less than about $3 \times 10^3$ cm$^{-1}$, less than about $1 \times 10^3$ cm$^{-2}$, less than about $3 \times 10^2$ cm$^{-1}$, or less than $1 \times 10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

The free-standing laterally-grown group III metal nitride boule 409 or wafer 431 may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001) +c-plane, (000-1) −c-plane, {10-10} m-plane, {1 1 −2 0} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1±2}, {1 0 −1±3}, {2 1 −3±1}, or {3 0 −3±4}. The free-standing laterally-grown group III metal nitride boule or wafer may have an (h k i l) semipolar large-area surface orientation, where i=−(h+k) and l and at least one of h and k are nonzero.

A large-area surface of the free-standing laterally-grown group III metal nitride boule 409 or wafer 431 may be characterized by a value of M/D that is less than 0.003 degree/mm, less than 0.002 degree/mm, less than 0.001 degree/mm, less than 0.0005 degree/mm, less than 0.0002 degree/mm, or less than 0.0001 degree/mm, where M is the miscut variation, in degrees, across the large-area surface and D is the maximum dimension or diameter of the large-area surface, in millimeters. The miscut variation M is defined as the difference in miscut, with respect to a nominal crystallographic orientation, between the maximum value of the miscut and the minimum value of the miscut across the large-area surface.

In certain embodiments, a large-area surface of a free-standing laterally-grown group III metal nitride boule 409 or wafer 431 has a crystallographic orientation that is miscut from {10-10} m-plane by between about −60 degrees and about +60 degrees toward [0001] +c-direction and by up to about 10 degrees toward an orthogonal <1-210> a-direction. In certain embodiments, a large-area surface of the free-standing laterally-grown group III metal nitride boule 409 or wafer 431 has a crystallographic orientation that is miscut from {10-10} m-plane by between about −30 degrees and about +30 degrees toward [0001] +c-direction and by up to about 5 degrees toward an orthogonal <1-210> a-direction. In certain embodiments, a large-area surface of the free-standing laterally-grown group III metal nitride boule 409 or wafer 431 has a crystallographic orientation that is miscut from {10-10} m-plane by between about −5 degrees and about +5 degrees toward [0001] +c-direction and by up to about 1 degree toward an orthogonal <1-210> a-direction. The free-standing laterally-grown group III metal nitride boule 409 or wafer 431 may have a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$ on one or both of the two large-area surfaces.

The free-standing laterally-grown group III metal nitride boule 409 or wafer 431 may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The free-standing laterally-grown group III metal nitride boule 409 or wafer 431 may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the free-standing laterally-grown group III metal nitride boule 409 or wafer 431 has atomic impurity concentrations of at least one of oxygen (O), hydrogen (H), chlorine (Cl), silicon (Si), germanium (Ge), magnesium (Mg), carbon (C), iron (Fe), manganese (Mn), or cobalt (Co) is above about $1 \times 10^{16}$ cm$^{-3}$, above about $1 \times 10^{17}$ cm$^{-3}$, or above about $1 \times 10^{18}$ cm$^{-3}$, as quantified by calibrated secondary ion mass spectrometry (SIMS). In certain embodiments, the concentration of at least one, at least two, at least three, or at least four impurities chosen from O, H, Cl, Si, Ge, Mg, C, Fe, Mn, and Co have constant, above-background-level values across the surface to within ±50%, ±25%, ±20%, ±15%, ±10%, or ±5% across the surface, as quantified by a desired measurement technique, such as calibrated secondary ion mass spectrometry (SIMS). In preferred embodiments, the concentration of oxygen (O), averaged over the surface of the free-standing laterally-grown group III metal nitride boule or wafer is between about $1 \times 10^{17}$ cm$^{-3}$ and about $5 \times 10^{20}$ cm$^{-3}$, or between about $3 \times 10^{17}$ cm$^{-3}$ and about $5 \times 10^{19}$ cm$^{-3}$, and the concentrations of fluorine (F), sodium (Na), and potassium (K) are each below the SIMS sensitivity limit.

The free-standing laterally-grown group III metal nitride boule 409 or wafer 431 may be characterized by a wurtzite structure substantially free from any cubic entities or other crystal structures, the other structures being less than about 0.1% in volume in reference to the substantially wurtzite structure.

A free-standing laterally-grown group III metal nitride wafer 431 may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the free-standing laterally-grown group III metal nitride wafer 431 may have a concentration of macro defects, with a diameter or characteristic dimension greater than about 100 micrometers, of less than about 2 cm$^{-2}$, less than about 1 cm$^{-2}$, less than about 0.5 cm$^{-2}$, less than about 0.25 cm$^{-2}$, or less than about 0.1 cm$^{-2}$. The variation in miscut angle across a large-area surface of the free-standing laterally-grown group III metal nitride wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing laterally-grown group III metal nitride wafer, as measured over an area of at least 10 μm×10 μm, may be less than about 0.5 nanometer, less than about 0.2 nanometer, less than about 0.15 nanometer, less than about 0.1 nanometer, or less than about 0.10 nanometer. The freestanding laterally-grown group III metal nitride wafer may be characterized by n-type electrical conductivity, with a carrier concentration between about $1 \times 10^{17}$ cm$^{-3}$ and about $3 \times 10^{19}$ cm$^{-3}$ and a carrier mobility greater than about 100 cm$^2$/V-s. In alternative embodiments, the free-standing laterally-grown group III metal nitride wafer is characterized by p-type electrical conductivity, with a carrier concentration between about $1 \times 10^{15}$ cm$^{-3}$ and about $1 \times 10^{19}$ cm$^{-3}$. In still other embodiments, the free-standing laterally-grown group III metal nitride wafer 431 is characterized by semi-insulating electrical behavior, with a room-temperature resistivity greater than about $10^7$ ohm-centimeter, greater than about $10^8$ ohm-centimeter, greater than about $10^9$ ohm-centimeter, greater than about $10^{10}$ ohm-centimeter, or greater than about $10^{11}$ ohm-centimeter. In certain embodiments, the free-standing laterally-grown group III metal nitride wafer 431 is highly transparent, with an optical absorption coefficient at a wavelength of 400 nanometers that is less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$.

In some embodiments, the free-standing laterally-grown group III metal nitride boule 409 or wafer 431 is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, sawed, lapped, polished, etched, ground, and/or chemically-mechanically polished into wafers by methods that are known in the art. The surface of the wafers 431 may be characterized by a root-mean-square surface roughness measured over a 10-micrometer by 10-micrometer area that is less than about 1 nanometer or less than about 0.2 nanometers.

A wafer 431 formed by the one or more processes described above may be incorporated into a semiconductor structure. The semiconductor structure may comprise at least one $Al_xIn_yGa_{(1-x-y)}N$ epitaxial layer, where $0 \leq x$, y, $x+y \leq 1$. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a lamp or a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ cm$^{-2}$, a substantial fraction of $0.1 \times 0.1$ mm$^2$ devices could be expected to be free of dislocations. At a dislocation density of $10^2$ cm$^{-2}$, a substantial fraction of $1 \times 1$ mm$^2$ devices could be expected to be free of dislocations. The gallium-nitride-based electronic or optoelectronic device may be entirely free of stacking faults throughout its volume. For example, at a stacking fault density of 1 cm$^{-1}$, a substantial fraction of $10 \times 1$ mm$^2$ stripe-shaped devices, such as laser diodes with nonpolar or semipolar large-area surfaces and c-plane facets, could be expected to be free of stacking faults.

Figure 6A:
FIGS. 6A, 6B and 7 are cross-sectional diagrams illustrating methods and resulting optical, opto-electronic, or electrical devices according to embodiments of the present disclosure.
Figure 6B:
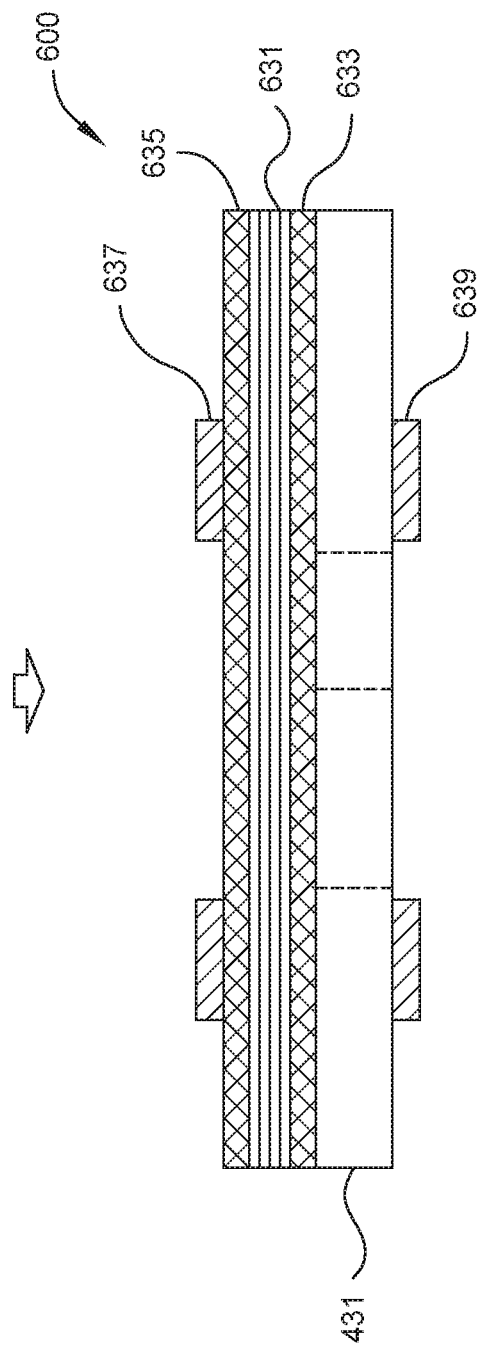
Figure 7:
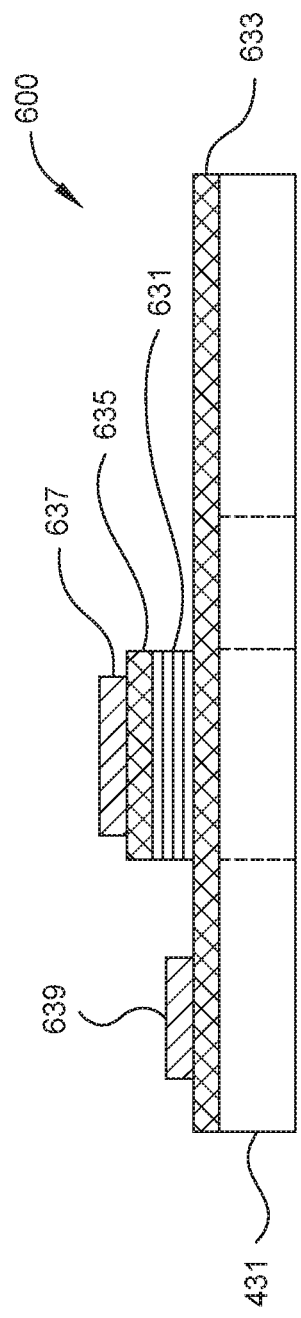

FIGS. 6A-6B and 7 are cross-sectional diagrams illustrating methods and resulting optical devices formed according to embodiments of the present disclosure. An optical, optoelectronic, or electrical device 600 is formed by a sequence of steps, including the step of epitaxial layer deposition atop free-standing laterally-grown group III metal nitride wafer 431 (FIG. 6A) having one or more coalescence fronts 419 comprising at least one AlInGaN active layer 631, e.g., by MOCVD. In certain embodiments, as illustrated in FIG. 6B, the deposited layers include an n-type layer 633, a doped or unintentionally doped single quantum well (SQW), a multiple quantum well (MQW) structure or double-heterostructure (DH structure), and a p-type layer 635, as shown. The device structures may be vertical, as illustrated schematically in FIG. 6B, or lateral, as illustrated schematically in FIG. 7. The device may be electrically connected to an external circuit to provide a potential between an n-type contact 639 and a p-type contact 637.

In a specific embodiment, the method also deposits an n-type contact 639, and a p-type contact 637. In some embodiments, at least one of the set of n-type contact 639 and p-type contact 637 is placed in specific registry respect to the coalescence fronts 419. The light emission portion may be centered over the coalescence front 419, or between coalescence fronts 419. In one specific embodiment, transparent p-type contacts 637 are aligned and formed in such a way that they avoid contact with coalescence fronts, 419 which may have an elevated concentration of threading dislocations. In this way a light-emitting structure may be formed has a relatively low concentration of threading dislocations, which may be advantageous for decreased droop, increased lifetime, reduced leakage current, or the like, as described above. In certain embodiments, a defective region associated with a coalescence front 419 or a window region 315 is utilized as a shunt path for reducing series resistance. In certain embodiments, n-type contacts 639 are placed above coalescence fronts 419 or window regions 315, with an edge dislocation density above $10^3$ cm$^{-1}$ and/or a threading dislocation density greater than about $10^6$ cm$^{-2}$.

Referring now to FIG. 7, in some embodiments, e.g., a laser diode, the p-type contact may be placed in a region substantially free of coalescence fronts 419. A mesa may be formed by conventional lithography and an n-type contact 639 placed in electrical contact with the n-type layer and/or the wafer 431.

Figure 8:
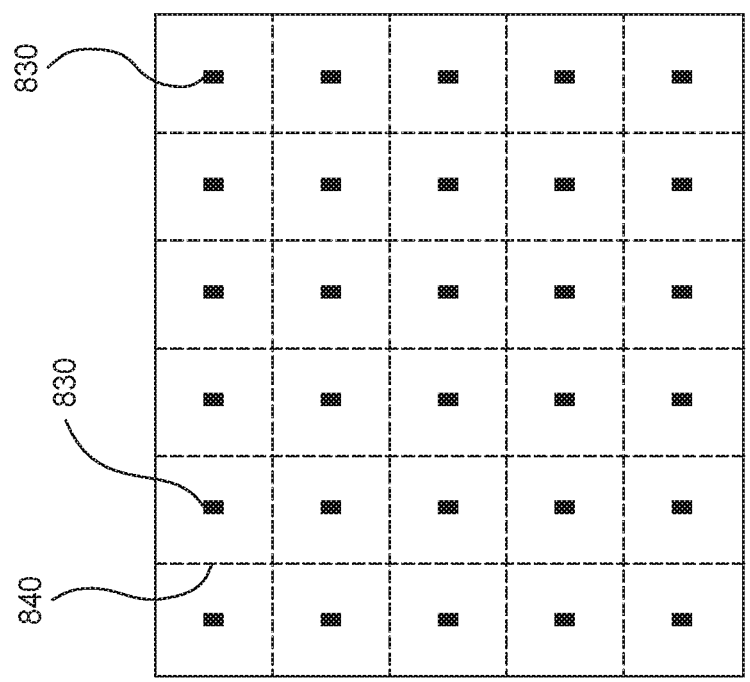
FIG. 8 shows a top view (plan view) of a free-standing laterally-grown GaN boule or wafer formed by ammonothermal lateral epitaxial growth using a mask layer having openings arranged in a 2D square array.

FIG. 8 shows a top view (plan view) of a free-standing laterally-grown GaN substrate formed by ammonothermal lateral epitaxial growth using a mask in the form of a 2D array. The GaN layer formed through the openings 111 in the original patterned mask layer 105 includes window regions

830. Coalescence of the GaN layer may form a two-dimensional grid of coalescence fronts 840 which may comprise, for example, an approximately linear array of dislocations formed by extended or repeated growth from a seed crystal comprising coalescence fronts 319.

Figure 9A:
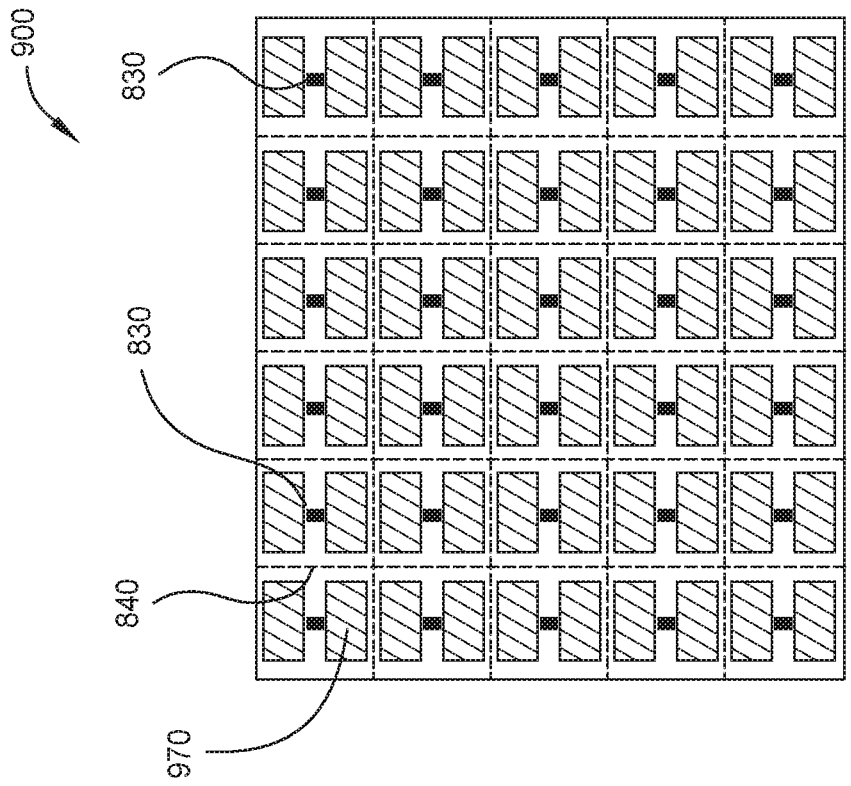
FIGS. 9A, 9B, and 9C are top views of a device structure, for example, of LEDs, according to embodiments of the present disclosure.
Figure 9C:
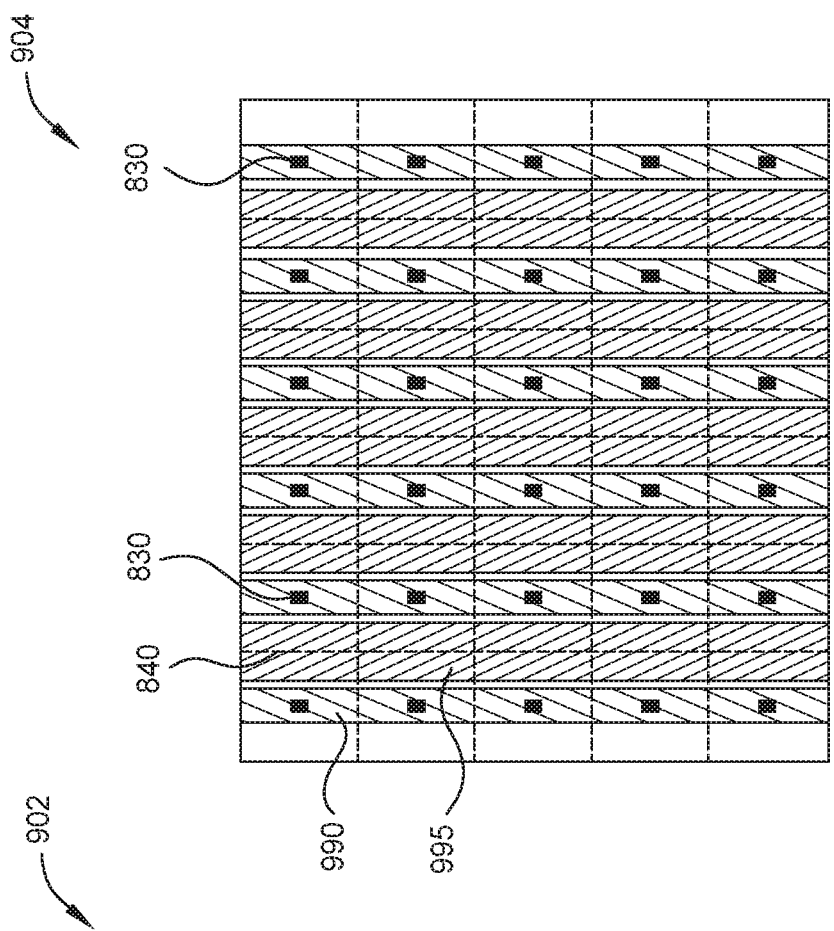
Figure 9B:
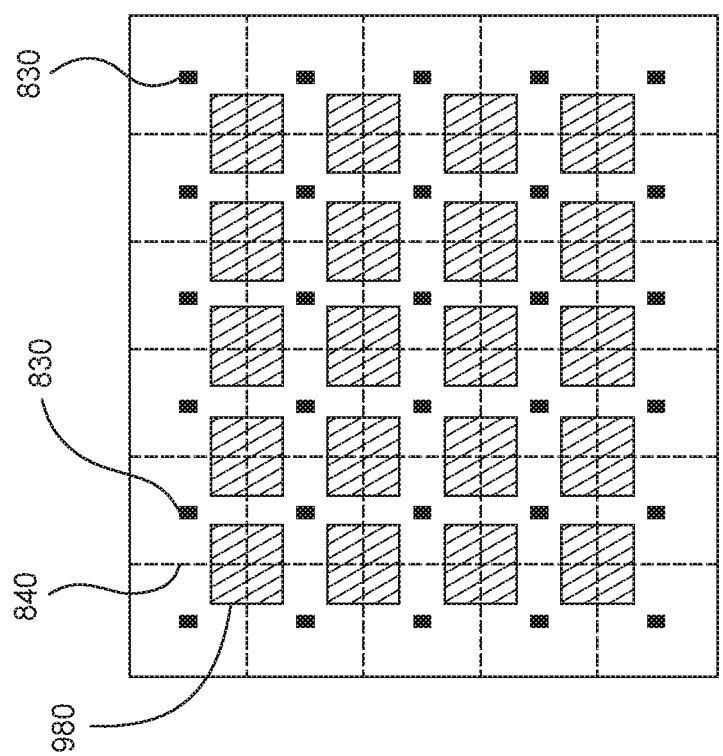

FIG. 9A shows a top view of a device structure 900, for example, of LEDs, where transparent p-type electrical contacts 970 (e.g., ITO, AZO, or other similar materials) have been aligned with respect to and placed so as not to be in contact with either the window regions 830 or the coalescence fronts 840. FIG. 9B illustrates a top view of an alternative embodiment of a device structure 902, for example, of LEDs, where electrical contacts 980 are again aligned with respect to window regions 830 and coalescence fronts 840 but now are positioned above coalescence fronts 840. FIG. 9C shows a top view of an alternative embodiment of a device structure 904, for example, of a flip-chip LED, where n-type electrical contacts 990 are aligned with respect to window regions 830 and p-type electrical contacts 995 are aligned between window regions 830.

Individual die, for example, light emitting diodes, laser diodes, or electronic devices may be formed by sawing, cleaving, slicing, singulating, or the like, between adjacent sets of electrical contacts. Referring again to FIG. 9A, slicing may be performed along coalescence fronts 840. Slicing may also be performed through window regions 830. Referring now to FIG. 9B, in certain embodiments, slicing may be performed through window regions 830 but not along coalescence fronts 840. Referring again to FIG. 9C, in certain embodiments, slicing is performed neither through the window regions nor along all coalescence fronts. Depending on the arrangement of the one- or two-dimensional array of window regions 830, the singulated die may have three corners, four corners, or six corners.

In certain embodiments, the light emitting diode, laser diode, or other optoelectronic or electronic device is incorporated into a luminaire, light source, module, or system.

The methods described herein provide means for fabricating large-area group III metal nitride boules or wafers, albeit having some potentially defective regions. The methods described herein provide means for fabricating high-performance light emitting diodes, laser diodes, and/or electronic devices that avoid potential issues associated with defective regions in the large-area group III metal nitride boules or wafers.

EXAMPLE 1

A sapphire substrate is provided, having a diameter of 150 millimeters and a thickness of 500 micrometers, that is miscut by 4 degrees from c-plane toward a-plane. The substrate is placed on a susceptor in an MOCVD reactor and the reactor evacuated. The substrate is thermally cleaned in an $H_2$ flow at a temperature of 1220 degrees Celsius at a pressure of 76 Torr for 15 minutes, then nitrided by switching the gas flow to $NH_3$ at a rate of 2 standard liters per minute for 5 minutes. The substrate temperature is then reduced to 1050 degrees Celsius and trimethyl gallium is introduced at a flow rate of 0.25 standard milliliters per minute in a $N_2$ carrier gas for 2 minutes to grow a nucleation layer. The substrate temperature is then increased to 1200 degrees Celsius, the pressure increased to 100 Torr, the $NH_3$ flow rate reduced to 1 standard liter per minute, the trimethyl gallium flow rate increased to 2 standard milliliters per minute, and the carrier gas is switched from $N_2$ to $H_2$, for 20 minutes to grow a high quality layer of N-face GaN. The substrate is then cooled and removed, providing an N-face GaN-on-sapphire template. The template is placed in a high density plasma reactor and a 100-nanometer-thick film of $SiO_2$ is deposited on the N-face GaN surface by plasma-enhanced chemical vapor deposition at a substrate temperature of 350 degrees Celsius. Using nLOF2020 as a photoresist, a pattern consisting of a hexagonal array of 10-micrometer-diameter of circular holes, with a pitch of 250 micrometers is defined. The $SiO_2$ under the openings in the patterned photoresist is etched by exposure to a buffered oxide etch solution at room temperature and then the remainder of the developed photoresist is stripped, preparing a patterned template similar to that shown schematically in FIG. 1L, with W=10 micrometers and L=250 micrometers.

The N-face template with a patterned $SiO_2$ mask is then placed in an HVPE reactor. A mixture of 0.05 standard liters per minute of HCl gas in a flow of 1 standard liter per minute of $H_2$ carrier gas were flowed over a crucible containing gallium metal at a temperature of 850 degrees Celsius. The reaction product, believed to be mainly GaCl, is then mixed with a flow of 0.6 standard liters per minute of $NH_3$, together with 0.5 standard cubic centimeter of $O_2$, in 4 standard liters per minutes of $H_2$ carrier gas and allowed to impinge on the patterned N-face template. For the first four hours of growth, the substrate temperature is held at 850 degrees Celsius and the reactor pressure is held at 60 Torr, during which time GaN grows through the openings in the patterned $SiO_2$ layer and forms isolated, hexagonal columns, approximately 50 micrometers high, similar to the structure shown schematically in FIG. 3A. Next, the substrate temperature is increased to 1080 degrees Celsius and the reactor pressure is increased to 760 Torr and held at these values for 48 hours, causing the tops of the hexagonal GaN columns to grow laterally and coalesce and the continuous GaN layer to reach an average thickness of 500 micrometers, with an air gap of approximately 100 micrometers, as shown schematically in FIG. 3C. The substrate is then cooled, and the thermal expansion mismatch between the sapphire substrate and the GaN layers causes fracture of the narrow GaN columns and formation of a free-standing GaN layer, as shown schematically in FIG. 4A. The edges of the free-standing GaN layer are ground and the free-standing GaN layer is multi-wire-sawed to form wafers. The wafers are then ground, polished, and chemical-mechanically polished according to methods that are well known in the art. The impurity levels in the wafers are determined by calibrated secondary ion mass spectrometry (SIMS). The concentration of oxygen is measured as $1.2 \times 10^{18}$ cm$^{-3}$, while the concentrations of hydrogen and carbon are near or below the sensitivity limits.

Although the above is a full description of specific embodiments, various modifications, alternative constructions and equivalents may be used. Therefore, the above description and illustrations should not be taken as limiting the scope of the present disclosure which is defined by the appended claims.

What is claimed is:

1. A method for forming a group III metal nitride boule or wafer, comprising:
    performing a nitridation process on a sapphire substrate, wherein the surface of the sapphire substrate is characterized by a crystallographic surface orientation that is miscut from (0001) by between 0.5 and 8 degrees,
    performing MOCVD growth of N-face GaN on the surface of the sapphire substrate;
    forming a pattern on the MOCVD-grown N-face GaN, wherein:
        the pattern comprises growth centers;

growing a (000-1)-oriented group III metal nitride layer from the pattern of growth centers vertically, in a first crystallographic direction by means of a first vapor-phase growth condition comprising a group III metal precursor formed by reaction of a group III metal with a halogen-containing gas and a nitrogen containing precursor;

further growing the (000-1)-oriented group III metal nitride layer laterally by means of a second vapor-phase growth condition, the second vapor-phase growth condition differing from the first vapor-phase growth condition by at least one of a lower pressure or a higher ratio of a flow rate of the nitrogen containing precursor to a flow rate of the halogen-containing gas, wherein a laterally-grown group III metal nitride layer coalesces in a region disposed between adjacent growth centers, and forming an air gap having a maximum vertical dimension between 25 micrometers and 5 millimeters between a surface of the laterally-grown group III metal nitride layer that defines a portion of a boundary of the air gap and an oppositely facing surface of the sapphire substrate or a mask thereupon; and separating the laterally-grown group III metal nitride layer from the sapphire substrate.

2. The method of claim 1, wherein the laterally-grown group III metal nitride layer comprises:
a group III metal selected from gallium, aluminum, indium, and a combination of any of the foregoing and nitrogen.

3. The method of claim 1, wherein the pattern comprises growth centers having a minimum dimension between 5 micrometers and 50 micrometers and at least pitch dimension between 500 micrometers and 2 millimeters.

4. The method of claim 1, wherein the air gap between the laterally-grown group III metal nitride layer and the sapphire substrate or a mask thereupon has a maximum vertical dimension between 100 micrometers and 1 millimeter.

5. The method of claim 1, wherein the laterally-grown group III metal nitride layer comprises a first surface that is characterized by a ratio of miscut variation to a diameter of the laterally-grown group III metal nitride layer of less than 0.002 degree per millimeter.

6. The method of claim 5, further comprising configuring the growth centers as mesas.

7. The method of claim 6, wherein the mesas are formed by a laser process.

8. The method of claim 5, wherein the first surface is further characterized by locally-approximately-linear arrays of threading dislocations, the threading dislocations within the locally-approximately-linear arrays having a concentration between $5$ $cm^{-1}$ and $10^5$ $cm^{-1}$.

9. The method of claim 8, wherein the first surface is further characterized by a plurality of wing regions disposed between adjacent pairs of locally-approximately-linear arrays of threading dislocations having an average concentration of threading dislocations below $10^5$ $cm^{-2}$ and a concentration of stacking faults below $10^3$ $cm^{-1}$.

10. The method of claim 9, wherein the first surface is further characterized by a plurality of window regions, each window region being positioned within one of the plurality of wing regions or between an adjacent pair of wing regions and having a minimum lateral dimension between 2 micrometers and 100 micrometers and being characterized by a concentration of threading dislocations between $10^4$ $cm^{-2}$ and $10^8$ $cm^{-2}$.

11. The method of claim 10, wherein a concentration of the stacking faults is below $1$ $cm^{-1}$.

12. The method of claim 8, wherein the locally-approximately-linear arrays are oriented within 5 degrees of a crystallographic plane selected from <1 0-1 0> or <1 1-2 0>.

13. The method of claim 8, wherein the first surface is characterized by a symmetric x-ray diffraction rocking-curve full width at half maximum value less than 100 arcsec, an overall dislocation density below $10^5$ $cm^{-2}$, and a concentration threading dislocation within regions disposed between adjacent pairs of locally-approximately-linear arrays of threading dislocations is below $10^4$ $cm^{-2}$.

14. The method of claim 5 wherein the first surface has a crystallographic orientation within 5 degrees of a (000-1) –c-plane.

15. The method of claim 5, wherein
the laterally-grown group III metal nitride layer further comprises a second surface, and
the laterally-grown group III metal nitride layer is characterized by a thickness between the first surface and the second surface between 0.1 millimeter and 1 millimeter, by a total thickness variation of less than 10 micrometers, and by a macroscopic bow less than 50 micrometers.

16. The method of claim 1, wherein the laterally-grown group III metal nitride layer has a surface that is characterized by an atomic impurity concentrations of at least one of oxygen (O), hydrogen (H), chlorine (Cl), silicon (Si), germanium (Ge), magnesium (Mg), carbon (C), iron (Fe), manganese (Mn), or cobalt (Co) is above $1 \times 10^{16}$ $cm^{-3}$, as quantified by calibrated secondary ion mass spectrometry (SIMS), wherein a concentration of at least one of these impurities is within ±50% of its average value across the surface.

17. The method of claim 16, wherein concentrations of at least two of O, H, Cl, Si, Ge, Mg, C, Fe, Mn, and Co are within ±50% of its average value across the surface, above background level values.

18. The method of claim 1, wherein the pattern is selected from two-dimensional hexagonal, square, rectangular, trapezoidal, triangular, and one-dimensional linear.

19. The method of claim 1, wherein a linear concentration of threading dislocations in the pattern is less than $1 \times 10^3$ $cm^{-1}$.

20. The method of claim 1, wherein the first vapor-phase growth condition is carried out at a temperature between 800 degrees Celsius and 1050 degrees Celsius, a ratio of flow rates of ammonia and a halogen-containing gas between 0.5 and 50, and a pressure between 0.8 atmosphere and 1.1 atmosphere.

21. The method of claim 20, wherein the second vapor-phase growth condition differs from the first vapor-phase growth condition by at least one of a pressure of the second vapor-phase growth condition between 0.01 and 0.7 atmosphere or a ratio of the flow rates of ammonia and halogen-containing gas being increased by a factor between 1.2× and 10×.

22. The method of claim 1, further comprising further growing the group III metal nitride layer vertically, by means of a third vapor-phase growth condition, the third vapor-phase growth condition differing from the second vapor-phase growth condition by at least one of a higher pressure or a lower ratio of the flow rate of the nitrogen containing precursor to the flow rate of the halogen-containing gas.

23. The method of claim 1, wherein the group III metal nitride layer has a thickness between 5 micrometers and 5 millimeters.

24. The method of claim 1, wherein the growth centers have a minimum dimension between 1 micrometer and 100 micrometers and are characterized by at least one pitch dimension between 20 micrometers and 5 millimeters.

25. The method of claim 1, wherein the surface of the sapphire substrate is miscut within 5 degrees from a +c-plane toward an a-plane.

\* \* \* \* \*